United States Patent
Shen et al.

(10) Patent No.: US 11,695,436 B2
(45) Date of Patent: Jul. 4, 2023

(54) CIRCUITS, DEVICES AND METHODS RELATED TO HALF-BRIDGE COMBINERS

(71) Applicant: SKYWORKS SOLUTIONS, INC., Irvine, CA (US)

(72) Inventors: Zhi Shen, Aliso Viejo, CA (US); Li Chen, Irvine, CA (US); William J. Domino, Yorba Linda, CA (US); Stephane Richard Marie Wloczysiak, Irvine, CA (US); Xiao Zhang, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 155 days.

(21) Appl. No.: 17/222,826

(22) Filed: Apr. 5, 2021

(65) Prior Publication Data

US 2021/0313947 A1    Oct. 7, 2021

Related U.S. Application Data

(60) Provisional application No. 63/005,426, filed on Apr. 5, 2020, provisional application No. 63/005,427, filed (Continued)

(51) Int. Cl.
*H04B 1/00* (2006.01)
*H03H 3/08* (2006.01)
(Continued)

(52) U.S. Cl.
CPC ........... *H04B 1/006* (2013.01); *H03H 1/0007* (2013.01); *H03H 3/08* (2013.01); *H03H 7/46* (2013.01); *H04B 1/0078* (2013.01); *H04B 1/18* (2013.01); *H04B 1/40* (2013.01); *H04W 72/23* (2023.01); *H03H 2001/0014* (2013.01); *H03H 2001/0092* (2013.01)

(58) Field of Classification Search
CPC .... H03H 3/08; H03H 7/46; H03H 2001/0092; H04B 1/006
USPC .................. 333/32, 17.1, 17.3, 124–126
See application file for complete search history.

(56) References Cited

U.S. PATENT DOCUMENTS 6,249,687 B1   6/2001   Thomsen et al.
6,703,763 B2   3/2004   Tsai et al.
(Continued)

FOREIGN PATENT DOCUMENTS

WO   PCT/US2021/029614   4/2021

OTHER PUBLICATIONS

U.S. Appl. No. 17/222,822, US, Bridge Combiners and Filters for Radio-Frequency Applications, filed Apr. 5, 2021.
(Continued)

*Primary Examiner* — Rakesh B Patel
(74) *Attorney, Agent, or Firm* — Chang & Hale LLP

(57) ABSTRACT

A half-bride combiner can be implemented as a coupling circuit having a common node and configured to couple the common node to one of first and second groups of filters through a first path and to couple the common node to the other group through a second path. The coupling circuit can be further configured such that the impedance provided by each filter of the one of the first and second groups for a signal in each band of the other group results in the signal being sufficiently excluded from the first path.

20 Claims, 25 Drawing Sheets

Related U.S. Application Data on Apr. 5, 2020, provisional application No. 63/005,421, filed on Apr. 5, 2020, provisional application No. 63/005,425, filed on Apr. 5, 2020, provisional application No. 63/005,424, filed on Apr. 5, 2020.

(51) Int. Cl.

| | | |
|---|---|---|
| *H03H 7/46* | (2006.01) | |
| *H04B 1/18* | (2006.01) | |
| *H04B 1/40* | (2015.01) | |
| *H03H 1/00* | (2006.01) | |
| *H04W 72/23* | (2023.01) | |

(56) References Cited

U.S. PATENT DOCUMENTS

| | | | |
|---|---|---|---|
| 7,733,197 B2 | 6/2010 | Itou | |
| 9,154,356 B2 | 10/2015 | Tasic et al. | |
| 9,203,596 B2 | 12/2015 | Granger-Jones | |
| 9,553,619 B2 | 1/2017 | Domino | |
| 2015/0295596 A1* | 10/2015 | Wloczysiak | H04L 5/08 370/297 |
| 2016/0065255 A1* | 3/2016 | Domino | H04B 1/0483 455/114.2 |
| 2016/0182010 A1 | 6/2016 | Nakamura et al. | |
| 2018/0041174 A1 | 2/2018 | Muto | |
| 2019/0199321 A1 | 6/2019 | Nosaka | |
| 2019/0214959 A1 | 7/2019 | Nosaka | |
| 2019/0268027 A1 | 8/2019 | Wloczysiak et al. | |
| 2019/0386634 A1 | 12/2019 | Yasuda et al. | |
| 2020/0195295 A1 | 6/2020 | Kondo et al. | |
| 2020/0204156 A1 | 6/2020 | Nosaka | |
| 2020/0280296 A1 | 9/2020 | Mori | |
| 2021/0194452 A1 | 6/2021 | Tsukamoto et al. | |
| 2021/0234559 A1 | 7/2021 | Mori | |
| 2021/0242853 A1 | 8/2021 | Mori | |
| 2021/0336639 A1 | 10/2021 | Tsuda et al. | |
| 2022/0021357 A1 | 1/2022 | Takeuchi et al. | |
| 2022/0094376 A1 | 3/2022 | Tomita | |
| 2022/0109463 A1 | 4/2022 | Naniwa | |

OTHER PUBLICATIONS

U.S. Appl. No. 17/222,823, US, Architectures Having Bridge Combiners and Multiplexers, filed Apr. 5, 2021.

U.S. Appl. No. 17/222,824, US, Bridge Combiners Having Resonator, filed Apr. 5, 2021.

U.S. Appl. No. 17/222,825, US, Switching Circuits for Bridge Combiners, filed Apr. 5, 2021.

International Search Report dated Aug. 12, 2021 for PCT/US2021/029614.

Written Opinion dated Aug. 12, 2021 for PCT/US2021/029614.

* cited by examiner

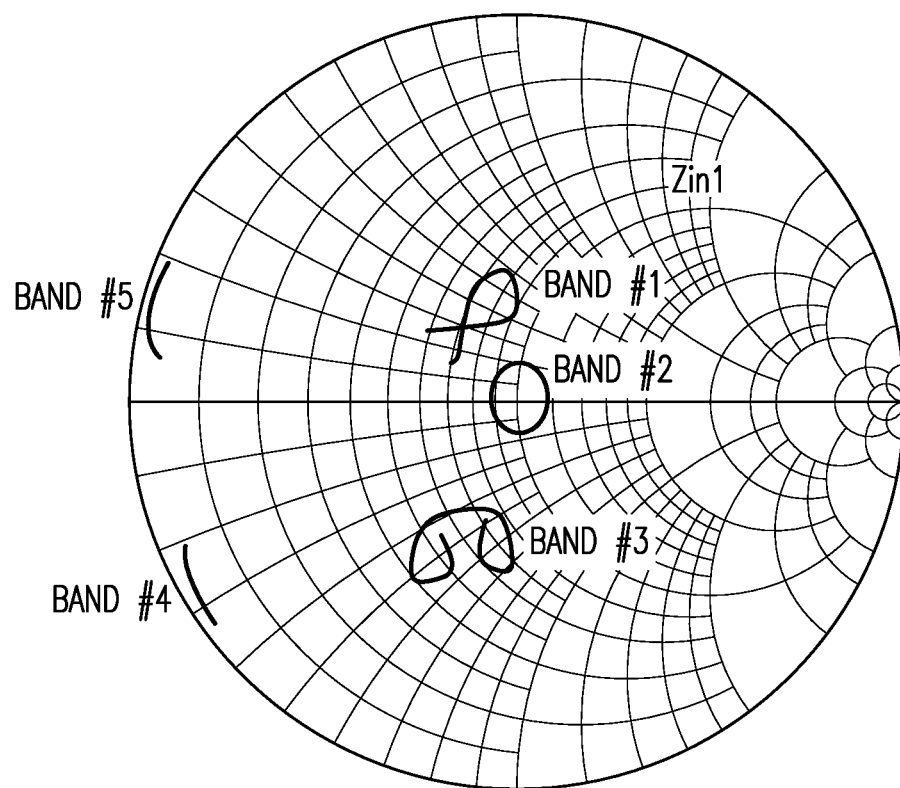
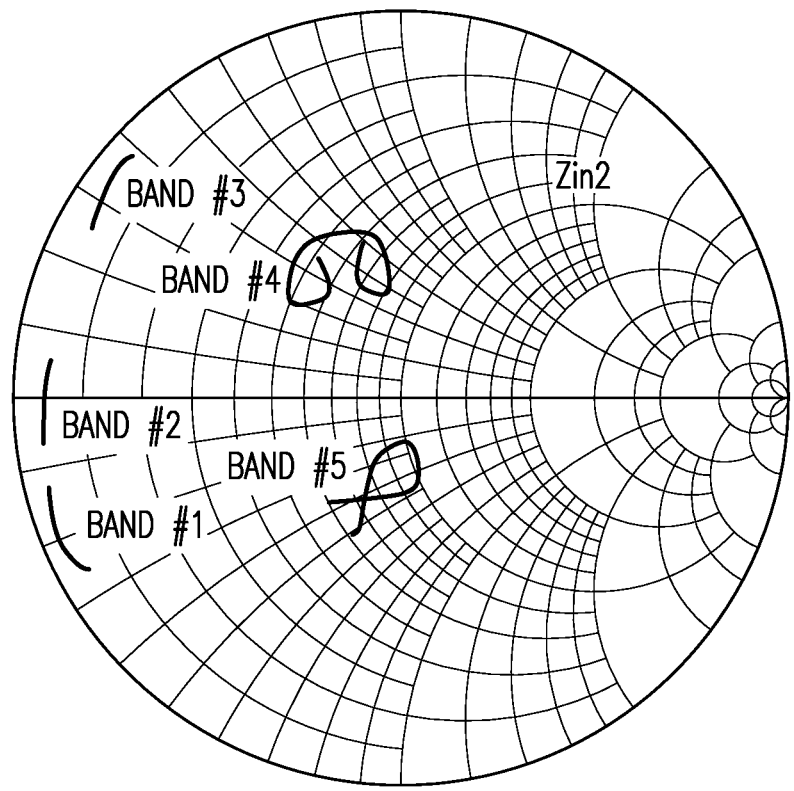
FIG.21

CIRCUITS, DEVICES AND METHODS RELATED TO HALF-BRIDGE COMBINERS

CROSS-REFERENCE TO RELATED APPLICATION(S)

This application claims priority to U.S. Provisional Application Nos. 63/005,424 filed Apr. 5, 2020, entitled ARCHITECTURES HAVING BRIDGE COMBINERS AND MULTIPLEXERS, 63/005,425 filed Apr. 5, 2020, entitled BRIDGE COMBINERS, PHASE SHIFTERS AND/OR RESONATORS FOR WIRELESS APPLICATIONS, 63/005,426 filed Apr. 5, 2020, entitled SWITCHING CIRCUITS FOR BRIDGE COMBINERS, 63/005,427 filed Apr. 5, 2020, entitled CIRCUITS, DEVICES AND METHODS RELATED TO HALF-BRIDGE COMBINERS, and 63/005,421 filed Apr. 5, 2020, entitled BRIDGE COMBINERS AND FILTERS FOR RADIO-FREQUENCY APPLICATIONS, the disclosure of each of which is hereby expressly incorporated by reference herein in its entirety.

BACKGROUND

Field

The present disclosure relates to bridge combiners and related circuits for radio-frequency (RF) applications.

Description of the Related Art

In radio-frequency (RF) applications, a signal having a plurality of frequency components can be routed from a common path to separate paths. In reverse, a plurality of signals can be routed from respective paths to a common path. Either or both of such functionalities allow, for example, carrier aggregation of a plurality of RF signals.

SUMMARY

In accordance with some implementations, the present disclosure relates to a radio-frequency architecture that includes a first group of plurality of filters each configured to support a band such that a first frequency range covers the respective plurality of bands, and a second group of one or more filters each configured to support a band such that a second frequency range covers the respective one or more bands. Each filter of one of the first and second groups is configured to provide an impedance at or near a short circuit impedance for a signal in each band of the other group, and each filter of the other group is configured to provide an approximately open circuit impedance for a signal in each band of the one of the first and second groups. The radio-frequency architecture further includes a coupling circuit having a common node and configured to couple the common node to one of the first and second groups through a first path and to couple the common node to the other group through a second path. The coupling circuit is further configured such that the impedance provided by each filter of the one of the first and second groups for the signal in each band of the other group results in the signal being sufficiently excluded from the first path.

In some embodiments, the coupling circuit can be further configured such that the approximately open circuit impedance provided by each filter of the other group for the signal in each band of the one of the first and second groups results in the signal being substantially excluded from the second path.

In some embodiments, the first group can be the one of the first and second groups and be configured to support a frequency range that is lower than a frequency range supported by the second group. In some embodiments, the coupling circuit can include an LC circuit that couples the common node to ground, with the LC circuit including an inductance L and a capacitance C in series such that the inductance L is between the common node and a first node and the capacitance C is between the first node and the ground, with the first node being coupled to the first group through the first path. The coupling circuit can be configured such that the common node is coupled to the second group through the second path.

In some embodiments, the second group can be the one of the first and second groups and be configured to support a frequency range that is higher than a frequency range supported by the first group. In some embodiments, the coupling circuit can include an LC circuit that couples the common node to ground, with the LC circuit including a capacitance C and an inductance L in series such that the capacitance C is between the common node and a second node and the inductance L is between the second node and the ground, with the second node being coupled to the second group through the second path. The coupling circuit can be configured such that the common node is coupled to the first group through the first path.

In some implementations, the present disclosure relates to a packaged module that includes a packaging substrate configured to receive a plurality of components, and a radio-frequency circuit implemented on the packaging substrate. The radio-frequency circuit includes a first group of plurality of filters each configured to support a band such that a first frequency range covers the respective plurality of bands, and a second group of one or more filters each configured to support a band such that a second frequency range covers the respective one or more bands. Each filter of one of the first and second groups is configured to provide an impedance at or near a short circuit impedance for a signal in each band of the other group, and each filter of the other group is configured to provide an approximately open circuit impedance for a signal in each band of the one of the first and second groups. The radio-frequency circuit further includes a coupling circuit having a common node and configured to couple the common node to the one of the first and second groups through a first path and to couple the common node to the other group through a second path. The coupling circuit is further configured such that the impedance provided by each filter of the one of the first and second groups for the signal in each band of the other group results in the signal being sufficiently excluded from the first path.

In some teachings, the present disclosure relates to a wireless device that includes one or more antennas, and a front-end module in communication with the one or more antennas. The front-end module includes a radio-frequency circuit having a first group of plurality of filters each configured to support a band such that a first frequency range covers the respective plurality of bands, and a second group of one or more filters each configured to support a band such that a second frequency range covers the respective one or more bands. Each filter of one of the first and second groups is configured to provide an impedance at or near a short circuit impedance for a signal in each band of the other group, and each filter of the other group is configured to provide an approximately open circuit impedance for a signal in each band of the one of the first and second groups. The radio-frequency circuit further includes a coupling circuit having a common node and configured to couple the common node to the one of the first and second groups through a first path and to couple the common node to the other group through a second path. The coupling circuit is further configured such that the impedance provided by each filter of the one of the first and second groups for the signal in each band of the other group results in the signal being sufficiently excluded from the first path. The wireless device further includes a receiver configured to process one or more signals associated with the first and second group.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 21 shows scans of impedances for the example architecture of FIG. 20.

DETAILED DESCRIPTION OF SOME EMBODIMENTS

The headings provided herein, if any, are for convenience only and do not necessarily affect the scope or meaning of the claimed invention.

Among others, PCT Publication No. WO2016/033427 (International Application No. PCT/US2015/047378 titled DOMINO CIRCUIT AND RELATED ARCHITECTURES AND METHODS FOR CARRIER AGGREGATION) discloses circuits, architectures and methods related to coupling circuits that can be utilized for carrier aggregation operations. For the purpose of description, such a coupling circuit can also be referred to as a bridge circuit, a Domino circuit, or a Domino bridge circuit.

Figure 1:
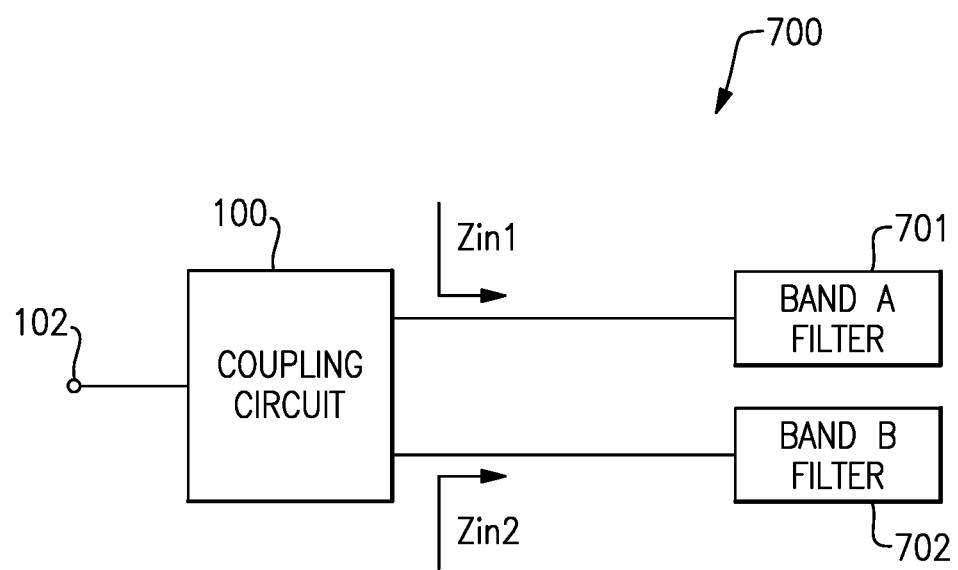
FIG. 1 depicts an architecture that can be implemented utilizing a coupling circuit having one or more features as described herein.

FIG. 1 depicts an architecture 700 that can be implemented utilizing a coupling circuit 100 having one or more features as described herein. In some embodiments, such a coupling circuit can include one or more of the examples disclosed in the above-mentioned PCT Publication No. WO2016/033427.

In the example architecture 700 of FIG. 1, the coupling circuit 100 is shown to couple a common signal node 102 to a first signal processing component 701 (Band A component such as Band A filter) and a second signal processing component 702 (Band B component such as Band B filter). Configured in the foregoing manner, impedance Zin1 presented to the coupling circuit 100 can be equal to (or approximately equal to) a load impedance (e.g., 50 Ohm) of the Band A filter for a Band A signal, and be equal to (or approximately equal to) zero for a Band B signal. Similarly, impedance Zin2 presented to the coupling circuit 100 can be equal to (or approximately equal to) a load impedance (e.g., 50 Ohm) of the Band B filter for the Band B signal, and be equal to (or approximately equal to) zero for the Band A signal.

As disclosed in PCT Publication No. WO2016/033427, the coupling circuit 100 can be configured to couple the foregoing first and second signal paths associated with the Band A and Band B filters, such that the approximately zero impedance presented by the first signal path (with Band A filter) to the signal in the second frequency band (Band B signal) results in the signal in the second frequency band (Band B signal) being substantially excluded from the first signal path, and such that the approximately zero impedance presented by the second signal path (with Band B filter) to the signal in the first frequency band (Band A signal) results in the signal in the first frequency band (Band A signal) being substantially excluded from the second signal path.

In the example of FIG. 1, as well as some of the other examples described herein, impedances presented by respective filters are depicted in the context of a flow of signal(s) from a common signal node (102 in FIG. 1) to either or both of first and second signal paths associated with first (Band A) and second (Band B) filters. However, and as disclosed in PCT Publication No. WO2016/033427, it will be understood that one or more features of the present disclosure can also be implemented in a configuration where a flow of signal(s) is in reverse relative to the foregoing configuration.

Figure 2:
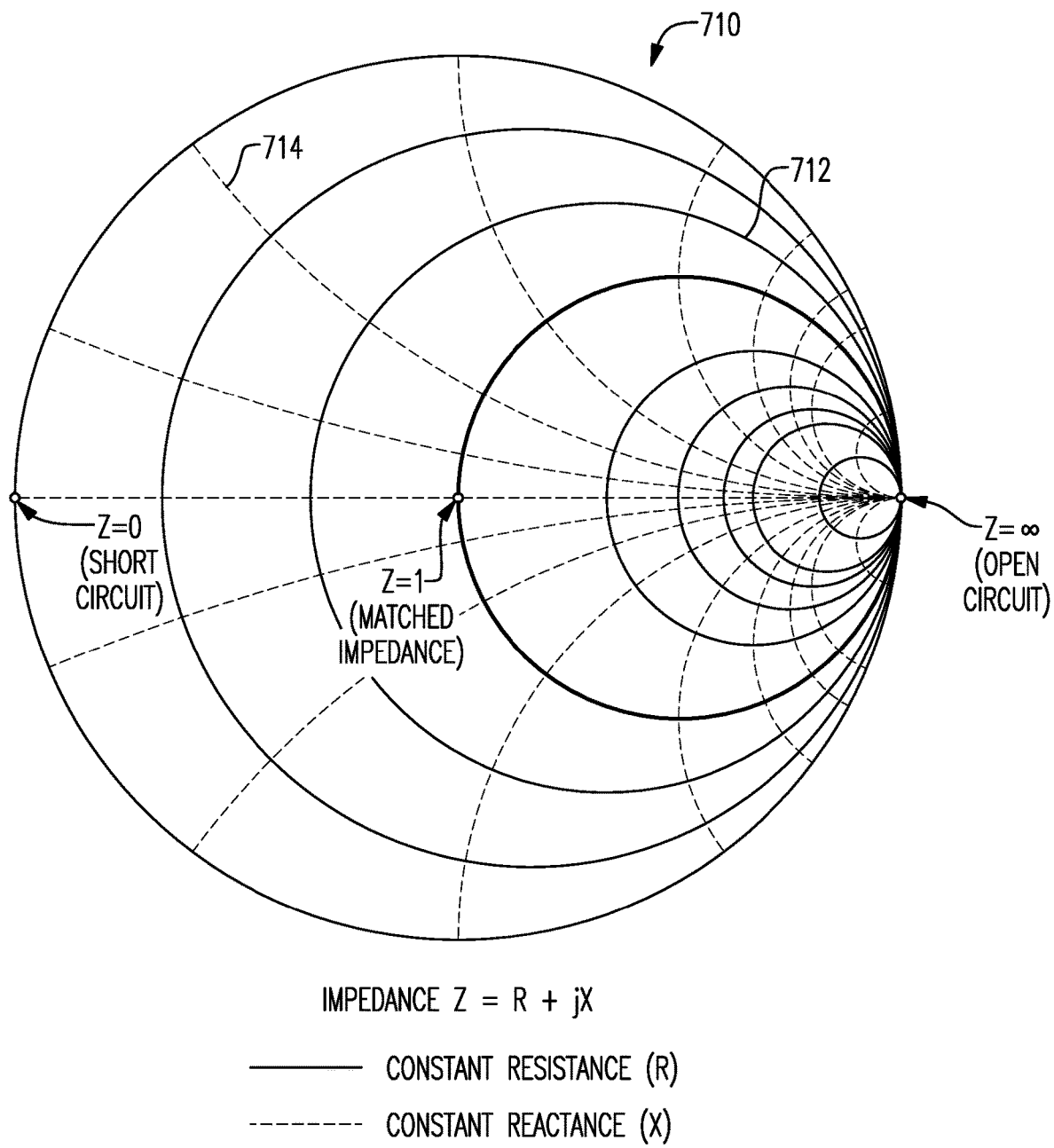
FIG. 2 shows a normalized Smith chart that provides a visual representation of an impedance.

FIG. 2 shows a normalized Smith chart 710 that provides a visual representation of an impedance $Z=R+jX$, where R is resistance and X is reactance. It is noted that for a pure capacitance, reactance X is equal to $X_C=-1/\omega C$ where $\omega=2\pi f$, and for a pure inductance, reactance X is equal to $X_L=\omega L$. Thus for a pure resistance, $Z=R$; for a pure capacitance, $Z=jX_C=-j/\omega C$, and for a pure inductance, $Z=jX_L=j\omega L$. It is also noted that an impedance in the region above the horizontal line of the Smith chart 710 has a positive imaginary value and represents an inductive impedance, and an impedance in the region below the horizontal line of the Smith chart 710 has a negative imaginary value and represents a capacitive impedance.

Referring to FIG. 2, the foregoing horizontal line segment is shown to bisect the outermost circle, with the left end of the horizontal line segment representing a short circuit (Z=0) state, and the right end of the horizontal line segment representing an open circuit (Z=∞) state. The mid-point of the horizontal line segment (and thus the center of the outermost circle) represents a matched impedance state. Such a matched impedance state has a value of Z=1 in the normalized representation. In an un-normalized representation, such a matched impedance state can have a value of, for example, Z=50 ohms.

In the normalized Smith chart of FIG. 2, solid-line circles are constant-resistance circles 712 at example normalized values. For example, the outermost circle referenced above has a constant-resistance value of 0, and the successively smaller circles have constant-resistance values of 0.2, 0.5, 1, 2, 3, 4, 5 and 10. All of such constant-resistance circles share their right-most points at the right end of the above-referenced horizontal line segment (open circuit state).

In the normalized Smith chart 710 of FIG. 2, dash-line arcs are constant-reactance arcs 714 at example normalized values. For example, the above-referenced horizontal line segment (an arc of an infinite-radius circle) has a constant-reactance value of 0, and the successively smaller-radius-circle arcs have constant-reactance values of 0.2, 0.5, 1, 2, 3, 4, 5 and 10. Such constant-reactance arcs can be provided above and below the horizontal line segment. For the arcs above the horizontal line segment, the arcs share their lower-most points at the right end of the horizontal line segment (open circuit state). For the arcs below the horizontal line segment, the arcs share their upper-most points at the right end of the horizontal line segment (open circuit state).

Figure 3A:
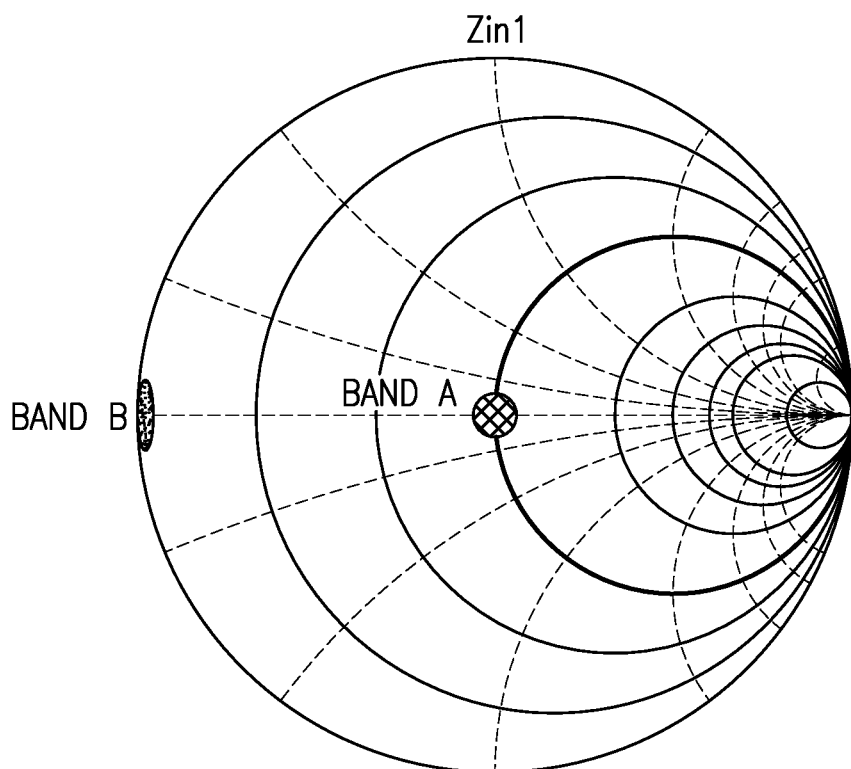
FIGS. 3A and 3B depict the example impedances of FIG. 1 on the normalized Smith chart of FIG. 2.
Figure 3B:
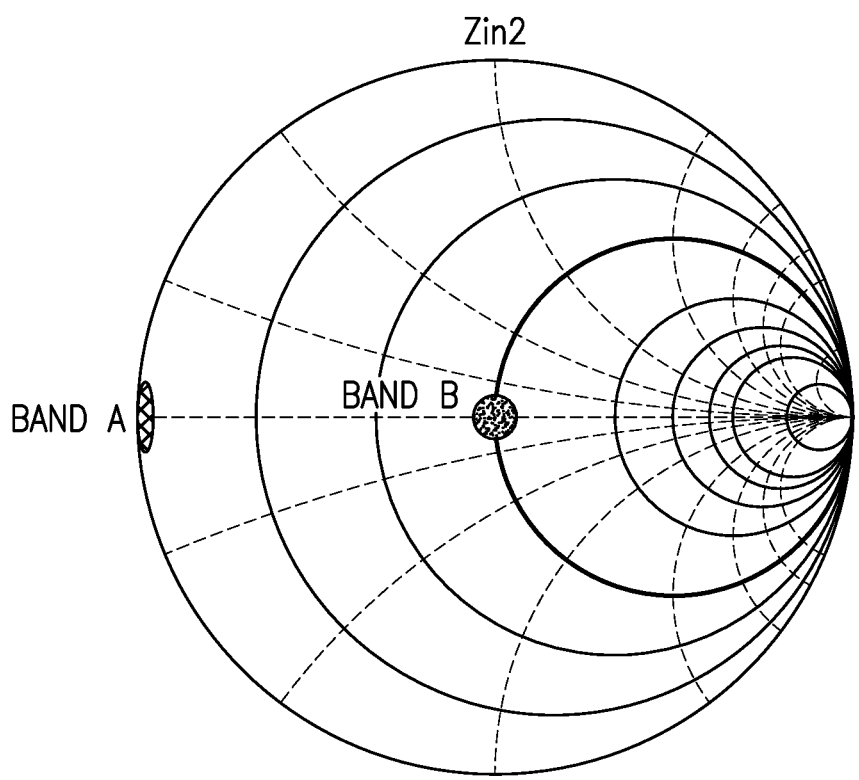

FIGS. 3A and 3B depict the example impedances Zin1 and Zin2 of FIG. 1, respectively, on the normalized Smith chart of FIG. 2. More particularly, FIG. 3A shows Zn1 having an impedance region at or about the matched impedance state (Z=1+i0) that includes impedance values associated with a frequency range of the first frequency band (Band A), and an impedance region at or about the short circuit state (Z=0+i0) that includes impedance values associated with a frequency range of the second frequency band (Band B). Similarly, FIG. 3B shows Zn2 having an impedance region at or about the matched impedance state (Z=1+i0) that includes impedance values associated with the frequency range of the second frequency band (Band B), and an impedance region at or about the short circuit state (Z=0+i0) that includes impedance values associated with the frequency range of the first frequency band (Band A).

Referring to the example of FIGS. 1 and 3, it is noted that the impedance states for Zin1 and Zin2 of FIGS. 3A and 3B can be considered to be ideal impedance states. However, in some embodiments, the Band A filter of the example of FIG. 1 can be a part of a group having a plurality of filters for supporting a plurality of respective bands, with the filters of the group being connectable to the first of two paths (e.g., the upper path associated with Zin1) associated with the coupling circuit 100. Similarly, the Band B filter of the example of FIG. 1 can be a part of a group having a plurality of filters for supporting a plurality of respective bands, with the filters of the group being connectable to the second of two paths (e.g., the lower path associated with Zin2) associated with the coupling circuit 100.

Figure 4:
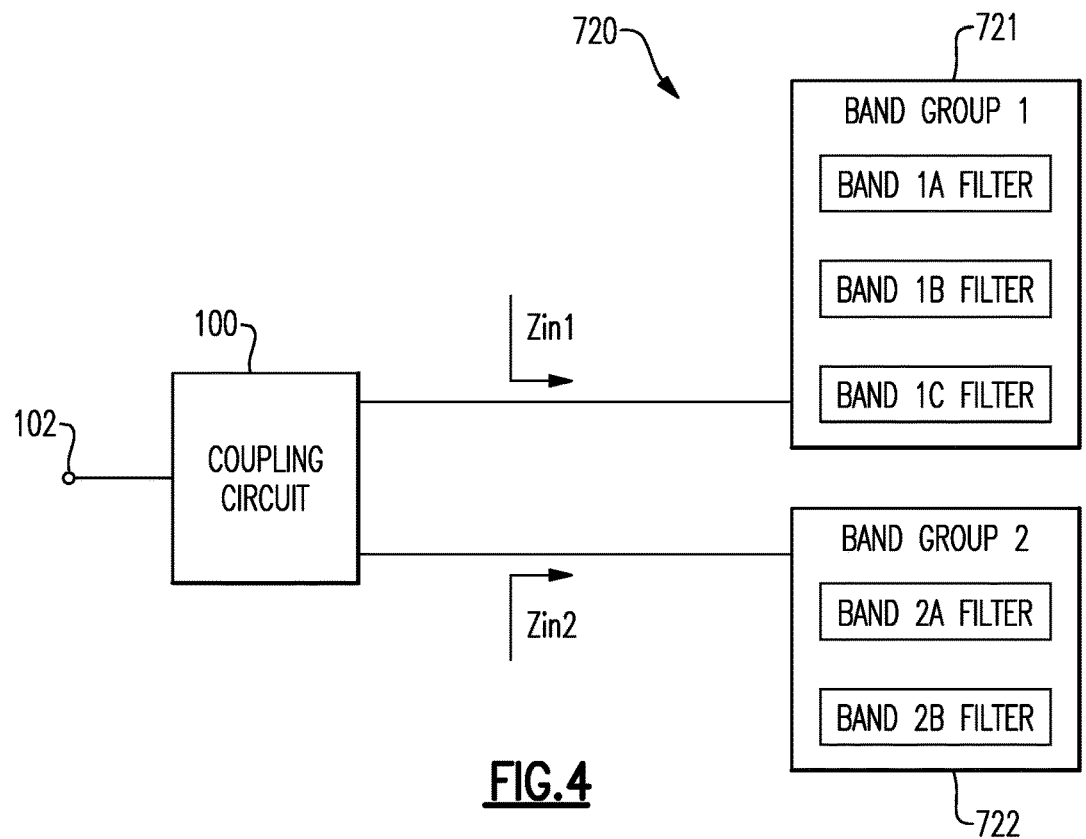
FIG. 4 shows an architecture that can be implemented similar to the example of FIG. 1, where a first group of filters includes three filters for supporting three bands, and a second group of filters includes two filters for supporting two bands.

For example, FIG. 4 shows an architecture 720 that can be implemented similar to the example of FIG. 1, but where a first group of filters 721 includes three filters for supporting three bands (Band 1A, Band 1B, Band 1C), and a second group of filters 722 includes two filters for supporting two bands (Band 2A, Band 2B). In such an architecture, a coupling circuit 100 is shown to couple a common signal node 102 to the first group of filters 721 and the second group of filters 722. Configured in the foregoing manner, impedance values for Zin1 are presented to the coupling circuit 100 for a signal in the band corresponding to a selected one of the filters of the first group of filters 721 and for a signal in the band corresponding to a selected one of the filters of the second group of filters 722. Similarly, impedance values for Zin2 are presented to the coupling circuit 100 for a signal in the band corresponding to the selected one of the filters of the second group of filters 722 and for a signal in the band corresponding to the selected one of the filters of the first group of filters 721.

In the example of FIG. 4, the first group of filters 721 is described as having three filters, and the second group of filters 722 is described as having two filters. It will be understood that each of the first and second groups of filters can also be implemented with different numbers of filters.

In the example of FIG. 4, each of the first and second groups of filters 721, 722 is described as having a plurality of filters. It will be understood that in some embodiments, one group can include a plurality of filters, and the other group can include a single filter.

Figure 5:
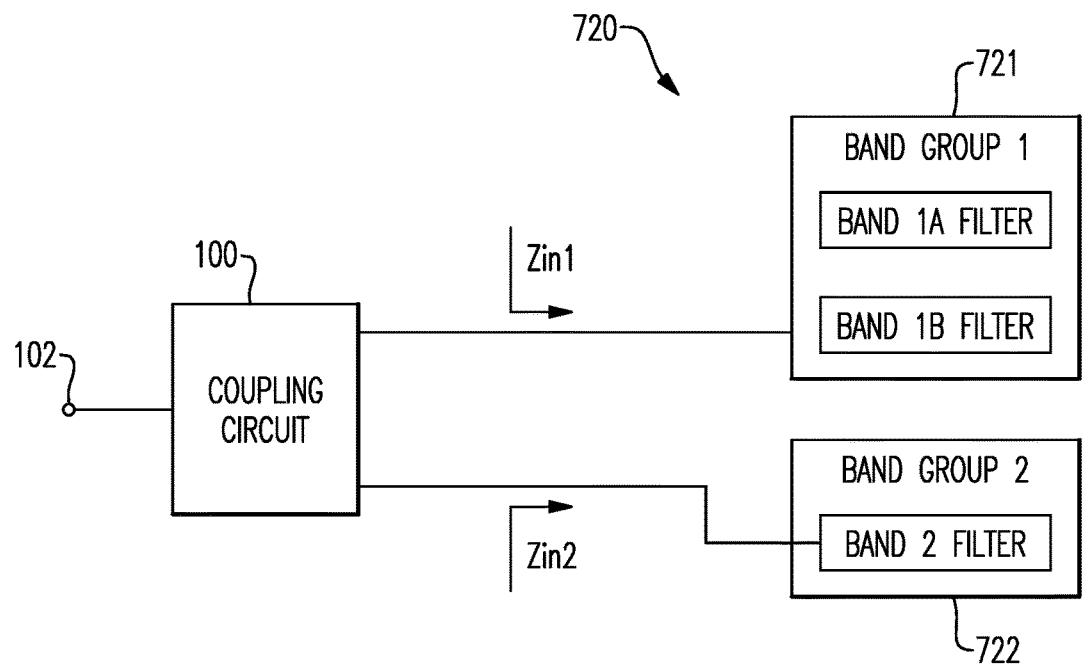
FIG. 5 shows an architecture where a first group of filters includes two filters for supporting two bands, and a second group of filters includes one filter for supporting one band.

For example, FIG. 5 shows an architecture 720 where a first group of filters 721 includes two filters for supporting two bands (Band 1A, Band 1B), and a second group of filters 722 includes one filter for supporting one band (Band 2). In such an architecture, a coupling circuit 100 is shown to couple a common signal node 102 to the first group of filters 721 and the single filter of the second group 722. Configured in the foregoing manner, impedance values for Zin1 are presented to the coupling circuit 100 for a signal in the band corresponding to a selected one of the filters of the first group of filters 721 and for a signal in the band corresponding to the single filter of the second group 722. Similarly, impedance values for Zin2 are presented to the coupling circuit 100 for a signal in the band corresponding to the single filter of the second group 722 and for a signal in the band corresponding to the selected one of the filters of the first group of filters 721.

In the examples of FIGS. 4 and 5, a selected filter in the first group 721 and a selected filter in the second group 722 can be configured so as to provide ideal impedance states, similar to the example of FIGS. 1 and 3. However, with such a configuration where two selected filters are optimized, performance can suffer significantly when using other (non-selected) filter(s) of the first and second groups 721, 722.

It is noted that in many applications, and especially when a group of filters involve a wide frequency range, it is impossible or difficult to achieve ideal impedance states (ideal matched impedance state and/or ideal short circuit state) for all of the filters in the group. However, in some embodiments, even if impedances Zin1 and Zin2 are not in ideal impedance states, desired or acceptable performance can be achieved if real parts of the complex impedances Zin1 and Zin2 are sufficiently close to the respective real parts of the ideal impedance states and imaginary parts of the complex impedances Zin1 and Zin2 are configured appropriately as described herein.

In some embodiments, each filter in a first group of filter(s) and a second group of filter(s) can be configured such that first and second impedances provided for first and second paths of a coupling circuit have complex parts that are conjugates, or approximately conjugates, of each other. More particularly, the first impedance provided for the first path of the coupling circuit can be expressed as $Z_1=R_1+jX$, and the second impedance provided for the second path of the coupling circuit can be expressed as $Z_2=R_2-jX$, where $-jX$ is a conjugate of $+jX$ of $Z_1$.

Figure 6:
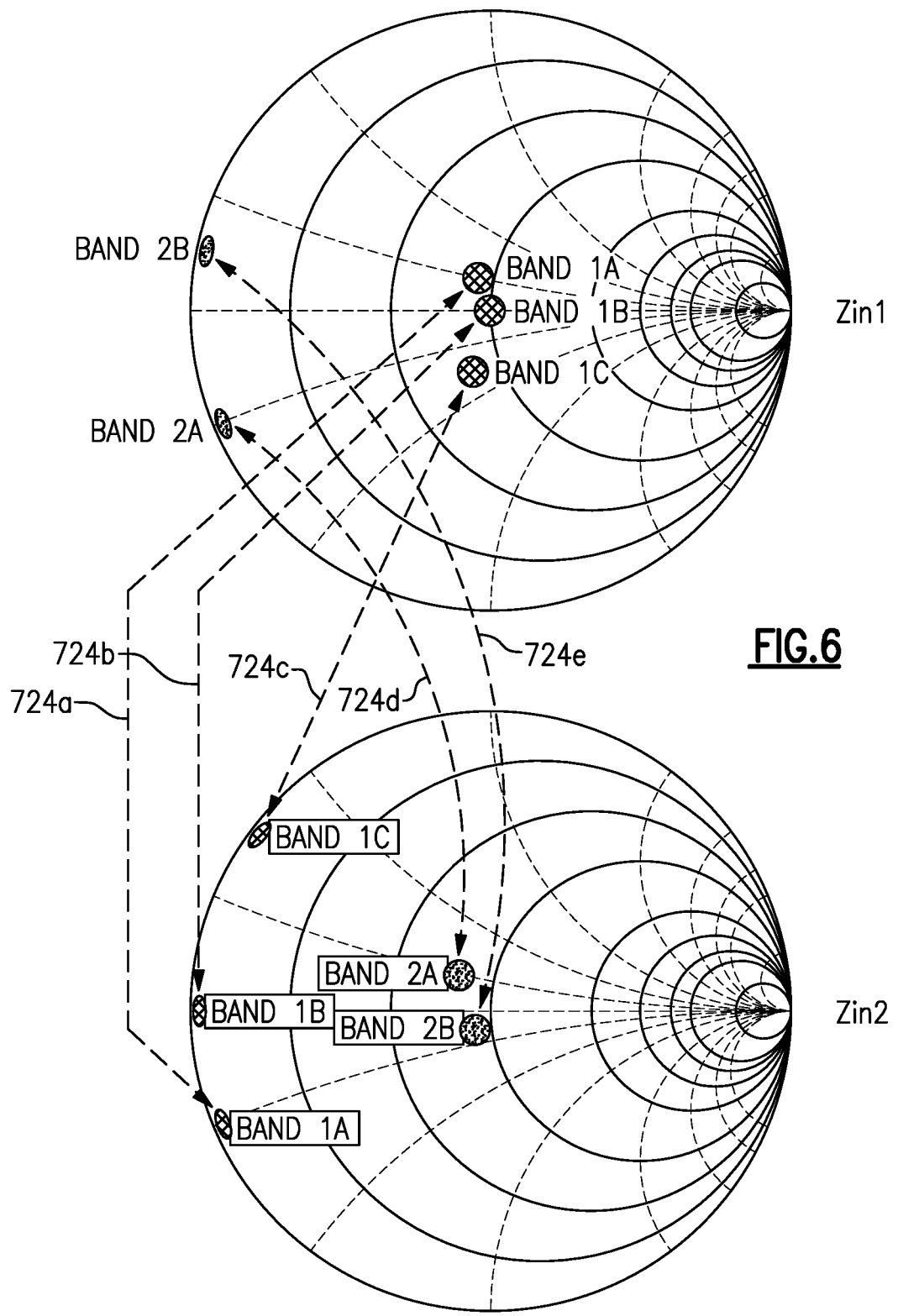
FIG. 6 shows that in some embodiments, a filter in a first group of filter(s) and a filter in a second group of filter(s) can be configured such that first and second impedances provided for first and second paths of a coupling circuit have complex parts that are conjugates, or approximately conjugates, of each other.

FIG. 6 shows the foregoing complex portion-conjugated impedances in terms of the first and second impedances Zin1 and Zin2 corresponding to the example architecture 720 of FIG. 4. In the example of FIG. 4, the three filters (Band 1A, Band 1B, Band 1C) of the first group 721 can have frequency bands F1A<F1B<F1C, respectively, and the two filters (Band 2A, Band 2B) of the second group 722 can have frequency bands F2A<F2B, respectively, such that F1A<F1B<F1C<F2A<F2B.

With the foregoing configurations of the filters of the first and second groups 721, 722, FIG. 6 depicts Smith charts for the impedances Zin1 and Zin1 of FIG. 4.

Referring to FIG. 6, impedances Zin1 for signals in the three bands (Band 1A, Band 1B, Band 1C) of the first group 721 are shown to be in regions at or close to the matched impedance value (e.g., Z=1 in normalized Smith chart), and impedances Zin1 for signals in the two bands (Band 2A, Band 2B) of the second group 722 are shown to be in regions at or close to the short circuit value (e.g., Z=0 in normalized Smith chart). Similarly, impedances Zin2 for signals in the two bands (Band 2A, Band 2B) of the second group 722 are shown to be in regions at or close to the matched impedance value, and impedances Zin2 for signals in the three bands (Band 1A, Band 1B, Band 1C) of the first group 721 are shown to be in regions at or close to the short circuit value.

In the example of FIG. 6, each filter is shown to provide Zin1 and Zin2 values having respective ones of real parts associated with matched impedance state (Z≈1) and short circuit state (Z≈0), and complex parts that are conjugates of each other. More particularly, for Band 1A, $Zin1=R_1+jX_1$ (with $R_1≈1$ and $X_1≠0$), and $Zin2=R'_1-jX_1$ (with $R'_1≈0$ and $X_1≠0$), with $+jX_1$ and $-jX_1$ of Zin1 and Zin2 being conjugates of each other, as depicted by arrow 724a. For Band 1B, $Zin1=R_2+jX_2$ (with $R_2≈1$ and $X_2≈0$), and $Zin2=R'_2-jX_2$ (with $R'_2≈0$ and $X_2≈0$), with $+jX_2$ and $-jX_2$ of Zin1 and Zin2 being conjugates of each other, as depicted by arrow 724b. For Band 1C, $Zin1=R_3-jX_3$ (with $R_3≈1$ and $X_3≠0$), and $Zin2=R'_3+jX_3$ (with $R'_3≈0$ and $X_3≠0$), with $-jX_3$ and $+jX_3$ of Zin1 and Zin2 being conjugates of each other, as depicted by arrow 724c.

Similarly, for Band 2A, $Zin2=R_4+jX_4$ (with $R_4≈1$ and $X_4≠0$), and $Zin1=R'_4-jX_4$ (with $R'_4≈0$ and $X_4≠0$), with $+jX_4$ and $-jX_4$ of Zin2 and Zin1 being conjugates of each other, as depicted by arrow 724d. For Band 2A, $Zin2=R_5-jX_5$ (with $R_5≈1$ and $X_5≠0$), and $Zin1=R'5\ jX_5$ (with $R'_5≈0$ and $X_5≠0$), with $-jX_5$ and $+jX_5$ of Zin2 and Zin1 being conjugates of each other, as depicted by arrow 724e.

It is noted that in the foregoing examples of Zin1 and Zin2 for the five bands of FIG. 6, if Zin1 for a given band is capacitive (i.e., impedance is in a region below the horizontal line of the Smith chart), then Zin2 for the same band is inductive (i.e., impedance is in a region above the horizontal line of the Smith chart). Similarly, if Zin1 for a given band is inductive, then Zin2 for the same band is capacitive.

In the example of FIGS. 4 and 6, suppose that each filter of a given group (e.g., the first group 721) is configured to provide the foregoing Zin1 and Zin2 impedances for the first and second paths of the coupling circuit 100. In some embodiments, the architecture 720 can be configured such that some or all of capacitive and inductive impedances of Zin1 and Zin2 are rotated toward desirable location(s) on a Smith chart. For example, a capacitive or inductive impedance close to a short circuit state can be rotated towards such a short circuit state so as to provide an impedance equal to, or approximately equal to, the short circuit impedance. In another example, a capacitive or inductive impedance close to a matched impedance state can be rotated towards such a matched impedance state so as to provide an impedance equal to, or approximately equal to, the matched impedance.

In some embodiments, the foregoing rotation of Zin1 and Zin2 impedances for the given group of filters can be implemented by, for example, configuring of another group (e.g., the second group 722), introduction of one or more phase shifting components, or some combination thereof. Examples of such phase shifting components are described herein in greater detail.

FIGS. 7-15 show examples of architectures that can be implemented utilizing one or more features described in reference to the examples of FIGS. 4-6.

Figure 7:
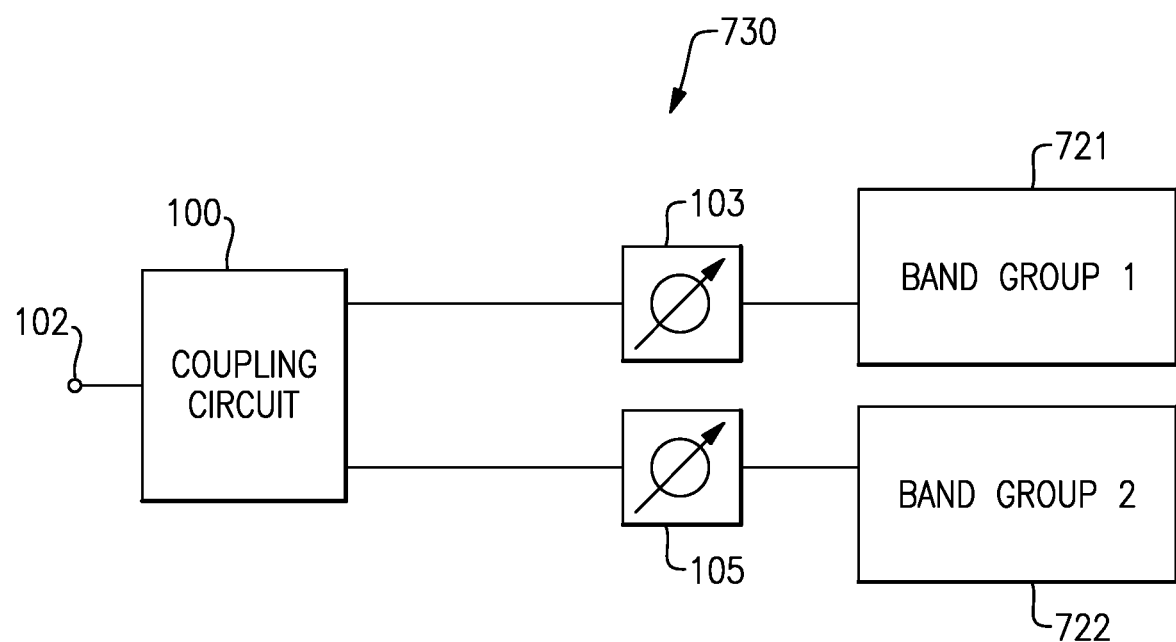
FIG. 7 shows an architecture that can be implemented similar to the examples of FIGS. 4 and 5, and with one or more phase shifters.

For example, FIG. 7 shows an architecture 730 that can be implemented similar to the examples of FIGS. 4 and 6, where a first group of filters 721 includes a plurality of filters, and a second group of filters 722 includes a plurality of filters. FIG. 7 shows that in some embodiments, the architecture 730 can further include a first phase shifter 103 implemented between the coupling circuit 100 and the first group of filters 721, and a second phase shifter 105 implemented between the coupling circuit 100 and the second group of filters 722. Additional examples related to the architecture 730 of FIG. 7 are described herein in greater detail.

Figure 8:
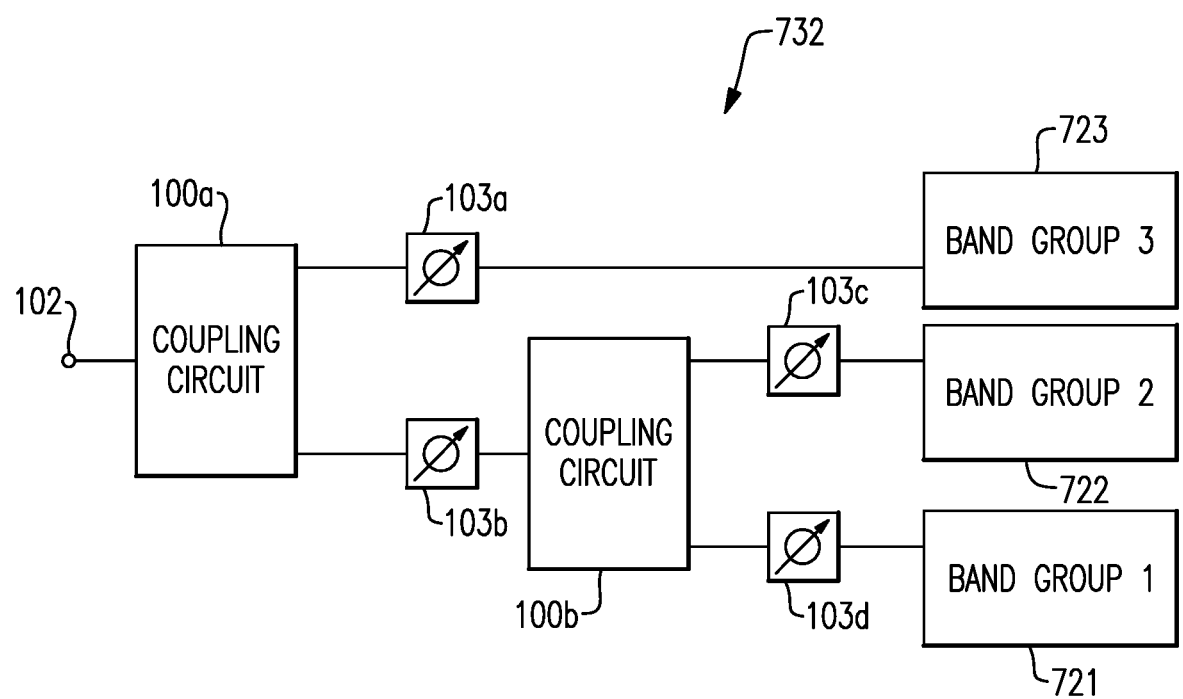
FIG. 8 shows an architecture that utilizes a plurality of coupling circuits with a plurality of groups of filters, where at least one group includes a plurality of filters for supporting different bands.

In another example, FIG. 8 shows an architecture 732 that utilizes a plurality of coupling circuits 100a, 100b with a plurality of groups of filters, where at least one group includes a plurality of filters for supporting different bands. In the example of FIG. 8, a first coupling circuit 100a is shown to couple a common signal node 102 to first and second paths, with the first path including a group of one or more filters 723, and the second path including a common signal node for a second coupling circuit 100b. The second coupling circuit 100b is shown to couple its common signal node to its first and second paths, with the first path including a group of one or more filters 722, and the second path including a group of one or more filters 721.

In the example of FIG. 8, phase shifters 103a, 103b are shown to be provided along the first and second paths associated with the first coupling circuit 100a. Similarly, phase shifters 103c, 103d are shown to be provided along the first and second paths associated with the second coupling circuit 100b. It will be understood that in some embodiments, some or all of such paths associated with the coupling circuits 100a, 100b can be implemented without phase shifter(s). Additional examples related to the architecture 732 of FIG. 8 are described herein in greater detail.

Figure 9:
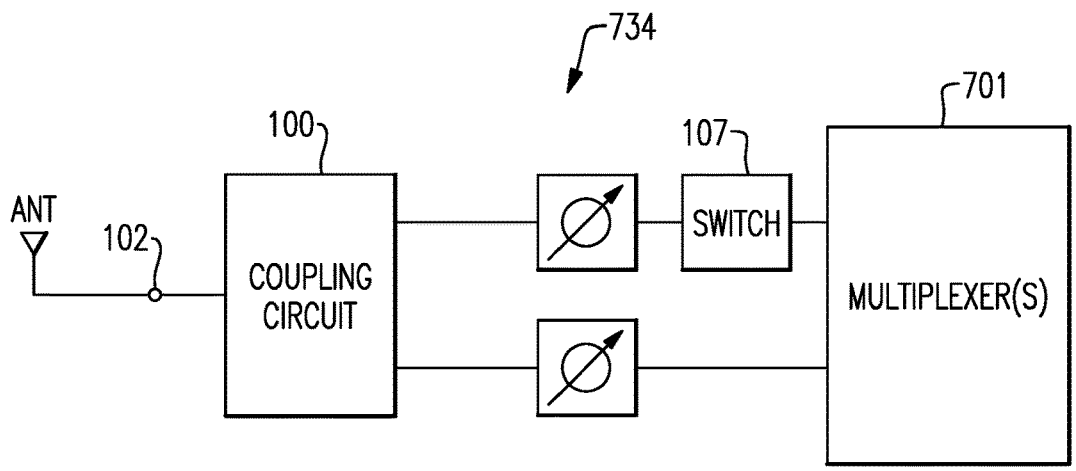
FIG. 9 shows an example of an architecture where a common signal node of a coupling circuit is coupled to an antenna, and first and second paths from the coupling circuit are coupled to one or more multiplexers.
Figure 10:
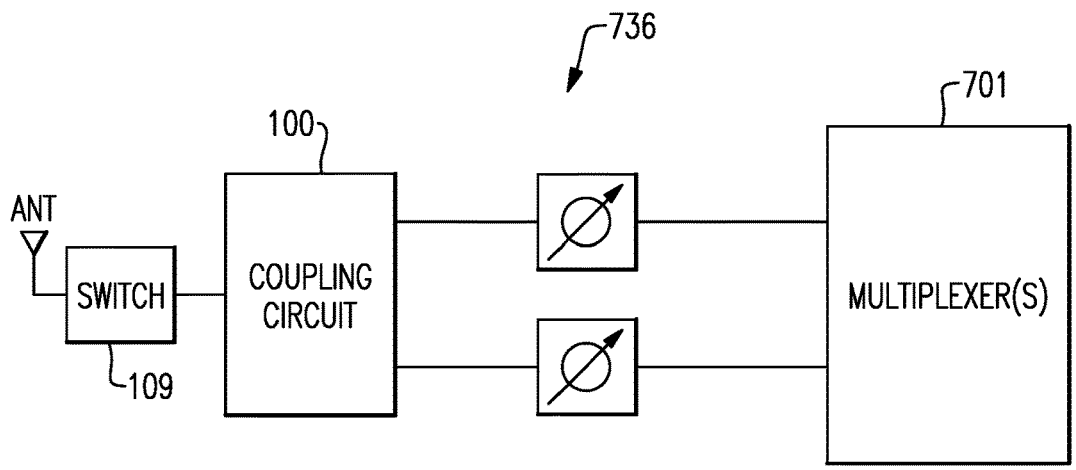
FIG. 10 shows another example of an architecture where a common signal node of a coupling circuit is coupled to an antenna, and first and second paths from the coupling circuit are coupled to one or more multiplexers.
Figure 11:
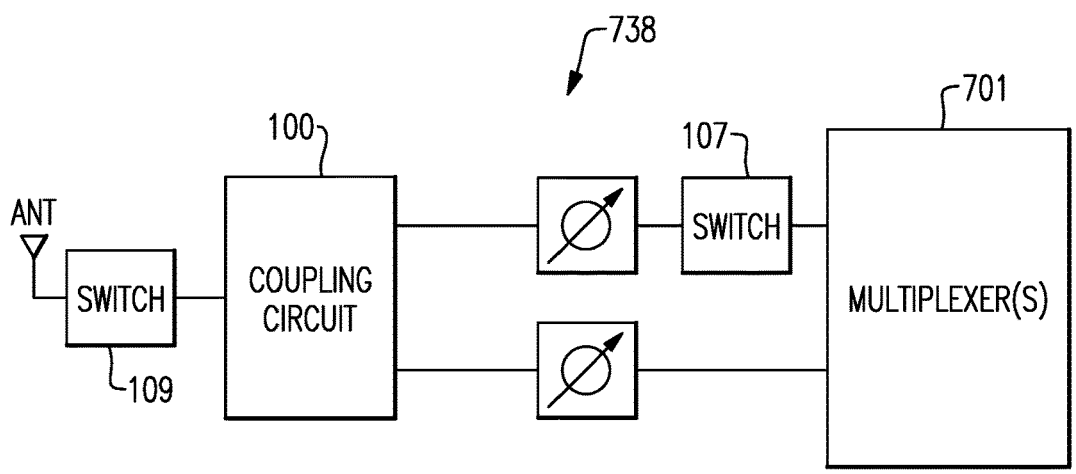
FIG. 11 shows yet another example of an architecture where a common signal node of a coupling circuit is coupled to an antenna, and first and second paths from the coupling circuit are coupled to one or more multiplexers.

In yet more examples, FIGS. 9-11 show architectures where a common signal node 102 of a coupling circuit 100 is coupled to an antenna, and first and second paths from the coupling circuit 100 are coupled to one or more multiplexers 701. For the purpose of description, such one or more multiplexers (701) can include one or more groups of filters, where at least one of such group(s) includes a plurality of different band filters. It will be understood that while each path from a respective coupling circuit is shown to include a phase shifter, such a path may or may not include a phase shifter.

Figure 12:
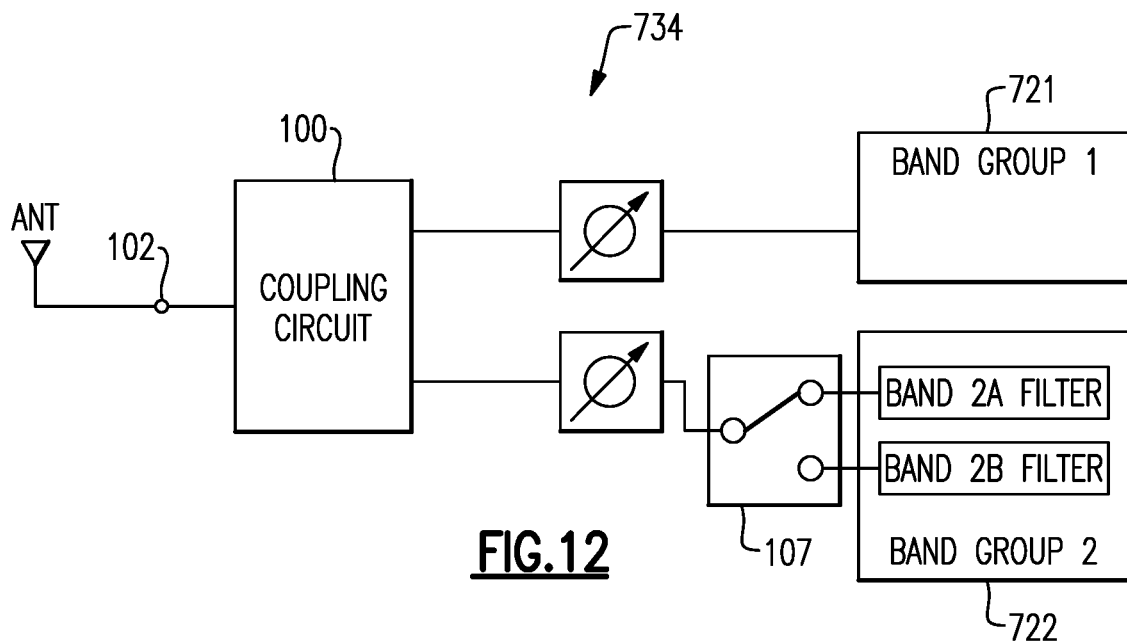
FIG. 12 shows an architecture that can be a more specific example of the architecture of FIG. 9.
Figure 13:
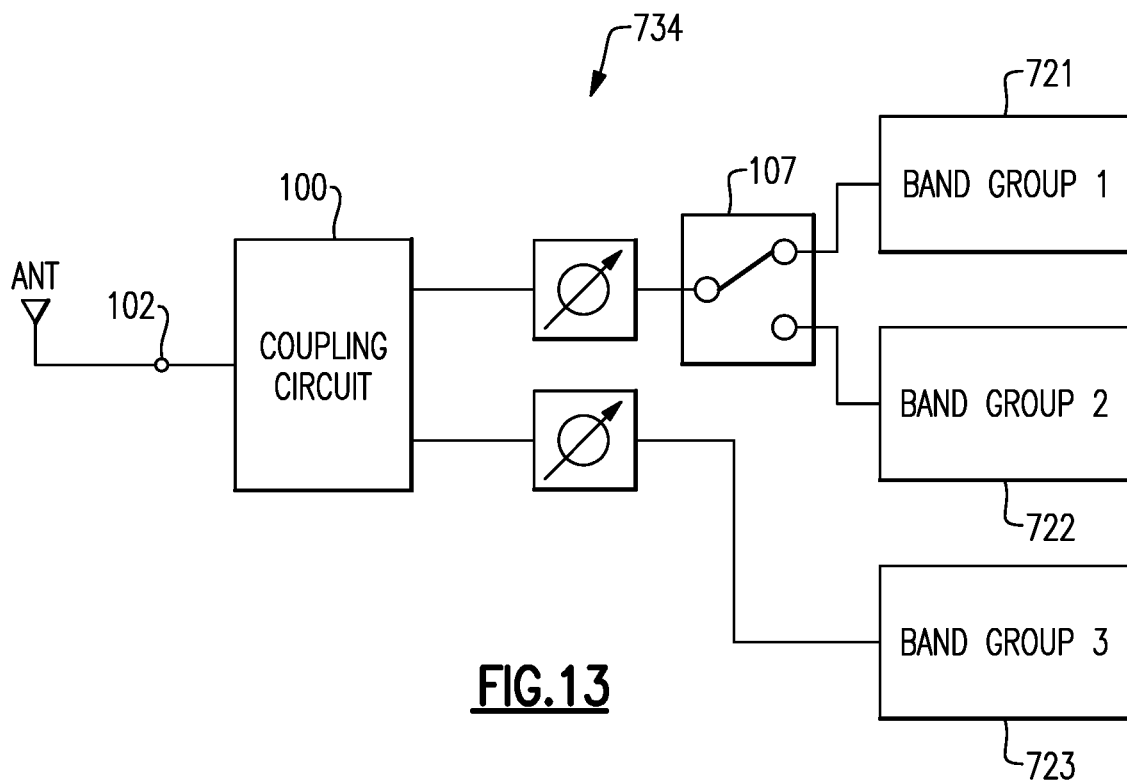
FIG. 13 shows an architecture that can be another more specific example of the architecture of FIG. 9.

In the example of FIG. 9, an architecture 734 can include a switching circuit 107 implemented along a path between the coupling circuit 100 and the multiplexer(s) 701. FIGS. 12 and 13 show more specific examples of such an architecture.

Figure 14:
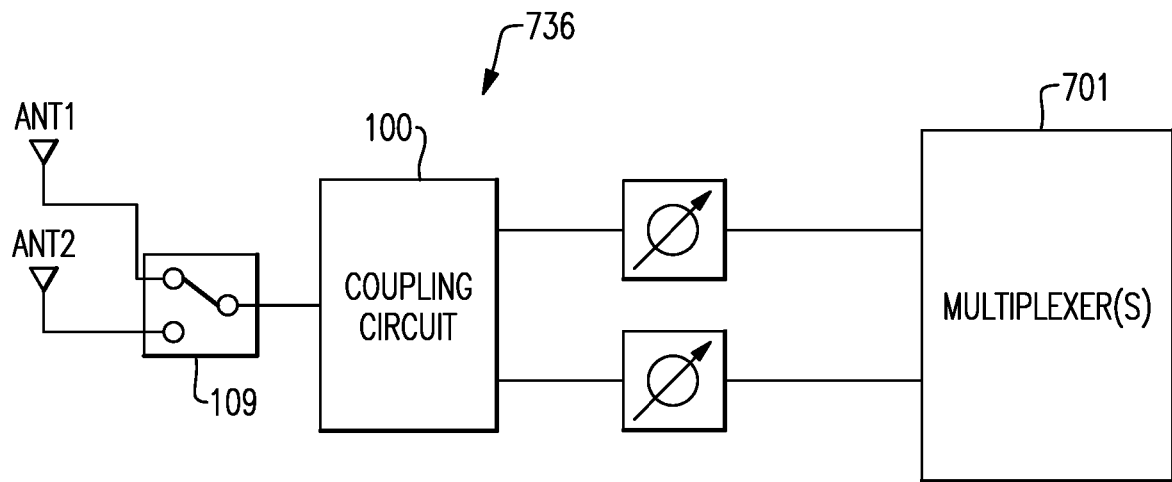
FIG. 14 shows an architecture that can be a more specific example of the architecture of FIG. 10.
Figure 15:
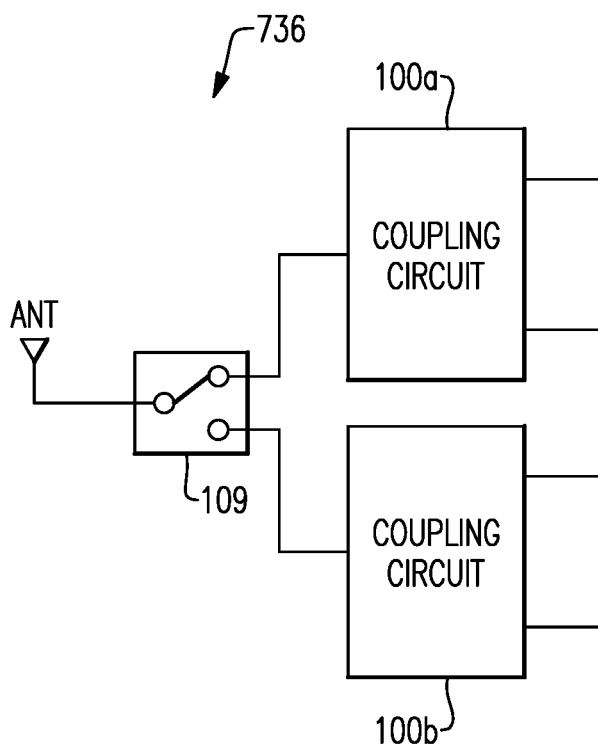
FIG. 15 shows an architecture that can be another more specific example of the architecture of FIG. 10.

In the example of FIG. 10, an architecture 736 can include a switching circuit 109 implemented between the coupling circuit 100 and one or more antennas. FIGS. 14 and 15 show more specific examples of such an architecture.

In the example of FIG. 11, an architecture 738 can include a switching circuit 107 implemented along a path between the coupling circuit 100 and the multiplexer(s) 701, as well as a switching circuit 109 implemented between the coupling circuit 100 and one or more antennas. Additional examples of such an architecture are described herein.

FIG. 12 shows an architecture 734 that can be a more specific example of the architecture 734 of FIG. 9. In the example of FIG. 12, a switch 107 can be implemented between a coupling circuit 100 and a group of filters 722, so as to allow selection of a filter among the filters within the same group 722. For example, suppose that the group of filters 722 includes Band 2A and Band 2B filters. The switch 107 can be configured to allow the coupling circuit 100 to be coupled to either of such two filters.

FIG. 13 shows an architecture 734 that can be another more specific example of the architecture 734 of FIG. 9. In the example of FIG. 13, a switch 107 can be implemented between a coupling circuit 100 and a plurality of groups of filters 722, so as to allow selection of a group among the groups. For example, suppose that the architecture 734 includes three groups of filters 721, 722, 723. The switch 107 can be configured to, for example, allow the coupling circuit 100 to be coupled to the group 721 or the group 722. It will be understood that the group 723 can also be switchably coupled to the coupling circuit 100 in a similar manner.

In some embodiments, the architecture 734 of FIG. 13 can include one or more switching function blocks to allow switchable selection of a filter within a given group. Similarly, in some embodiments, the architecture 734 of FIG. 12 can include one or more switching function blocks to allow switchable selection of a group among a plurality of groups. It will be understood that in some embodiments, such filter-group selection and filter-selection (within a given group) functionalities can be achieved by an appropriately configured switching network. Examples related to such a switching network are described herein in greater detail.

FIG. 14 shows an architecture 736 that can be a more specific example of the architecture 736 of FIG. 10. In the example of FIG. 14, a switch 109 can be implemented between a coupling circuit 100 and a plurality of antennas (e.g., ANT1, ANT2), so as to allow selection of an antenna to be coupled to a common signal node of the coupling circuit 100. In the example of FIG. 14, first and second paths from the coupling circuit 100 can be coupled to one or more multiplexers 701 as described herein.

FIG. 15 shows an architecture 736 that can be another more specific example of the architecture 736 of FIG. 10. In the example of FIG. 15, a switch 109 can be implemented between a common antenna (ANT) and a plurality of coupling circuits (e.g., 100a, 100b). Such a configuration can allow the common antenna (ANT) to be coupled to the common signal node of either of the coupling circuits 100a, 100b. In the example of FIG. 15, each of first and second paths from each coupling circuit (100a or 100b) can be coupled to a filter, a multiplexer, another coupling circuit, a switch, etc., including the various examples described herein.

Figure 16:
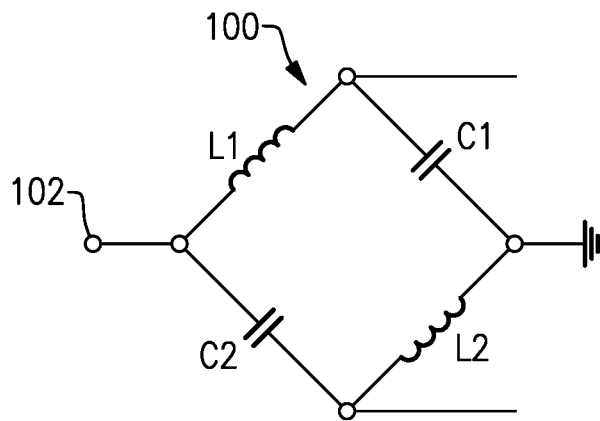
FIG. 16 shows that in some embodiments, an architecture having one or more features as described herein can include a coupling circuit that includes two LC circuits that couple an input node to ground.

FIGS. 16-18 show various examples of coupling circuits 100 that can be utilized in the various architectures as described herein. FIG. 16 shows that in some embodiments, an architecture having one or more features as described herein can include a coupling circuit 100 disclosed in PCT Publication No. WO2016/033427. More particularly, the coupling circuit 100 can include two LC circuits that couple an input node 102 to ground. The first LC circuit can include a first inductance L1 (on the input side) in series with a first capacitance C1 (on the ground side). The second LC circuit can include a second capacitance C2 (on the input side) in series with a second inductance L2 (on the ground side). A node between L1 and C1 is shown to be coupled to a first path, and a node between C2 and L2 is shown to be coupled to a second path.

Figure 17A:
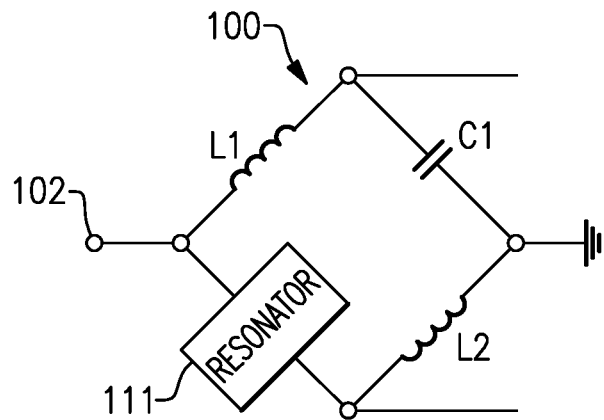
FIG. 17A shows that in some embodiments, an architecture having one or more features as described herein can include a coupling circuit having a resonator.

FIG. 17A shows that in some embodiments, an architecture having one or more features as described herein can include a coupling circuit 100 having a resonator 111. In some embodiments, such a resonator can replace a capacitance or an inductance in the coupling circuit 100 of FIG. 16. For example, the coupling circuit 100 of FIG. 17A is shown to include a resonator 111 that replaces the capacitance C2 of the coupling circuit 100 of FIG. 16. It will be understood that each of the other elements L1, C1, L2 of the coupling circuit 100 of FIG. 17A may or may not have the same value as the corresponding counterpart element (L1, C1 or L2) of the coupling circuit 100 of FIG. 16.

Figure 17B:
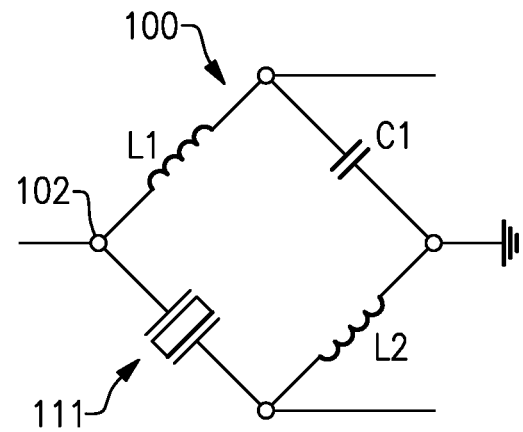
FIG. 17B shows that in some embodiments, the resonator of the coupling circuit of FIG. 17A can include an acoustic resonator.

FIG. 17B shows that in some embodiments, the resonator 111 of the coupling circuit 100 of FIG. 17A can include an acoustic resonator such as a bulk acoustic wave (BAW) resonator, any other BAW-based resonator, a surface acoustic wave (SAW) resonator (e.g., a temperature-compensated SAW (TC-SAW) resonator, a leaky SAW (LSAW) resonator, a longitudinal LSAW (LLSAW) resonator, a trapped SAW resonator), any acoustic resonator with sub-2 μm piezoelectric layer on interface of supporting substrate, or some combination thereof. An example of an architecture having such a resonator in a coupling circuit is described herein in greater detail.

Figure 18A:
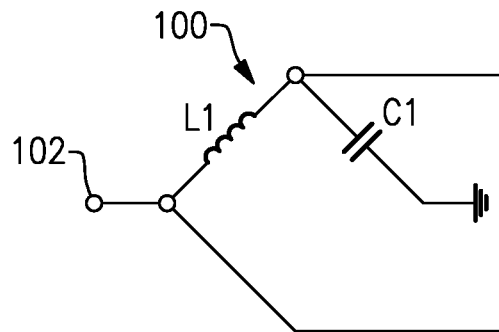
FIGS. 18A and 18B show that in some embodiments, an architecture having one or more features as described herein can include a coupling circuit having a half bridge configuration.
Figure 18B:
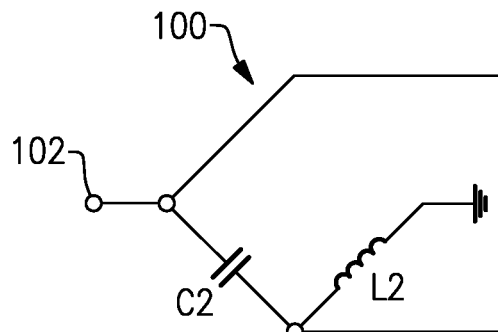

FIGS. 18A and 18B show that in some embodiments, an architecture having one or more features as described herein can include a coupling circuit 100 having a half bridge configuration. As disclosed in PCT Publication No. WO2016/033427, the coupling circuit 100 of FIG. 18A can be configured to provide a 3-pole low-pass filter functionality for the path coupled to the node between L1 and C1. Examples related to an architecture having such a half-bridge coupling circuit are described herein in greater detail.

Similarly, the coupling circuit 100 of FIG. 18B can be configured to provide a 3-pole high-pass filter functionality for the path coupled to the node between C2 and L2. Examples related to an architecture having such a half-bridge coupling circuit are described herein in greater detail.

Figure 19A:
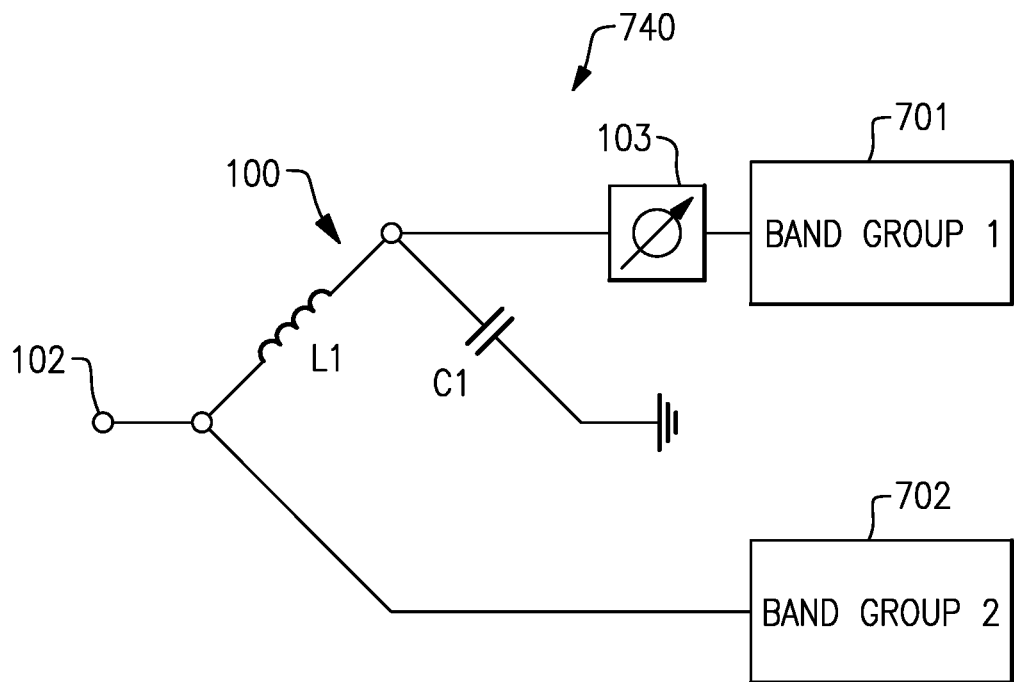
FIG. 19A shows an example architecture that includes the half-bridge coupling circuit of FIG. 18A.

FIG. 19A shows an example architecture 740 that includes the half-bridge coupling circuit 100 of FIG. 18A. In the example of FIG. 19A, the coupling circuit 100 couples a common signal node 102 to a first group of filters 701 through a node between L1 and C1. The common signal node 102 is also shown to be directly coupled to a second group of filters 702.

In the example of FIG. 19A, a phase shifter 103 is shown to be provided between the coupling circuit 100 and the first group of filters 701. In some embodiments, such a phase shifter can be configured to accommodate or compensate for a phase shift associated with a filter within the first group 701.

Figure 19B:
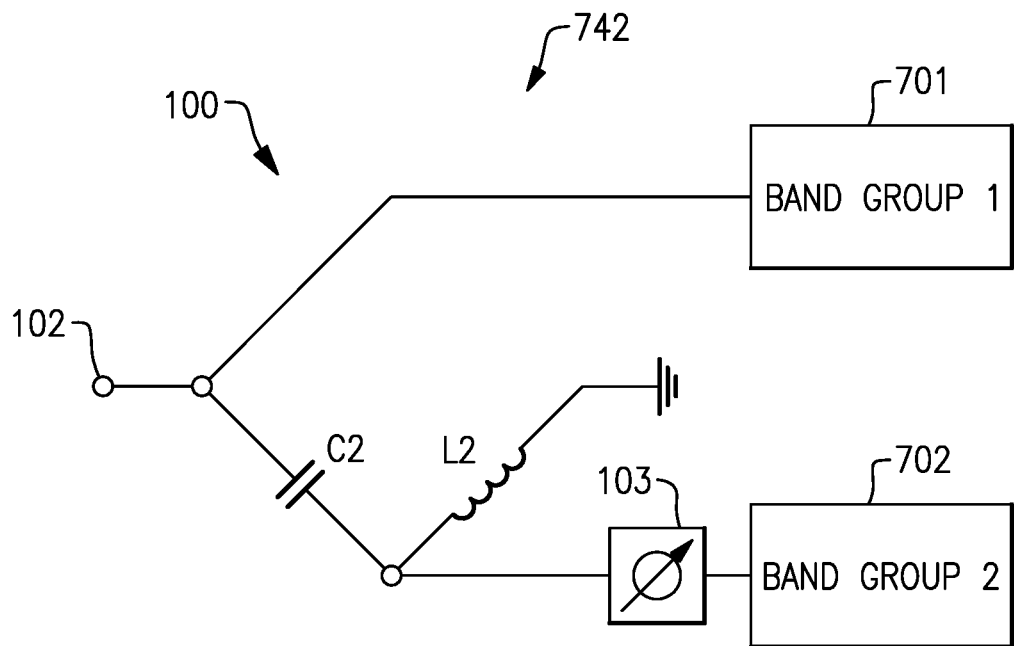
FIG. 19B shows an example architecture that includes the half-bridge coupling circuit of FIG. 18B.

FIG. 19B shows an example architecture 742 that includes the half-bridge coupling circuit 100 of FIG. 18B. In the example of FIG. 19B, the coupling circuit 100 couples a common signal node 102 to a second group of filters 702 through a node between C2 and L2. The common signal node 102 is also shown to be directly coupled to a first group of filters 701.

In the example of FIG. 19A, a phase shifter 103 is shown to be provided between the coupling circuit 100 and the second group of filters 702. In some embodiments, such a phase shifter can be configured to accommodate or compensate for a phase shift associated with a filter within the second group 702.

Figure 20:
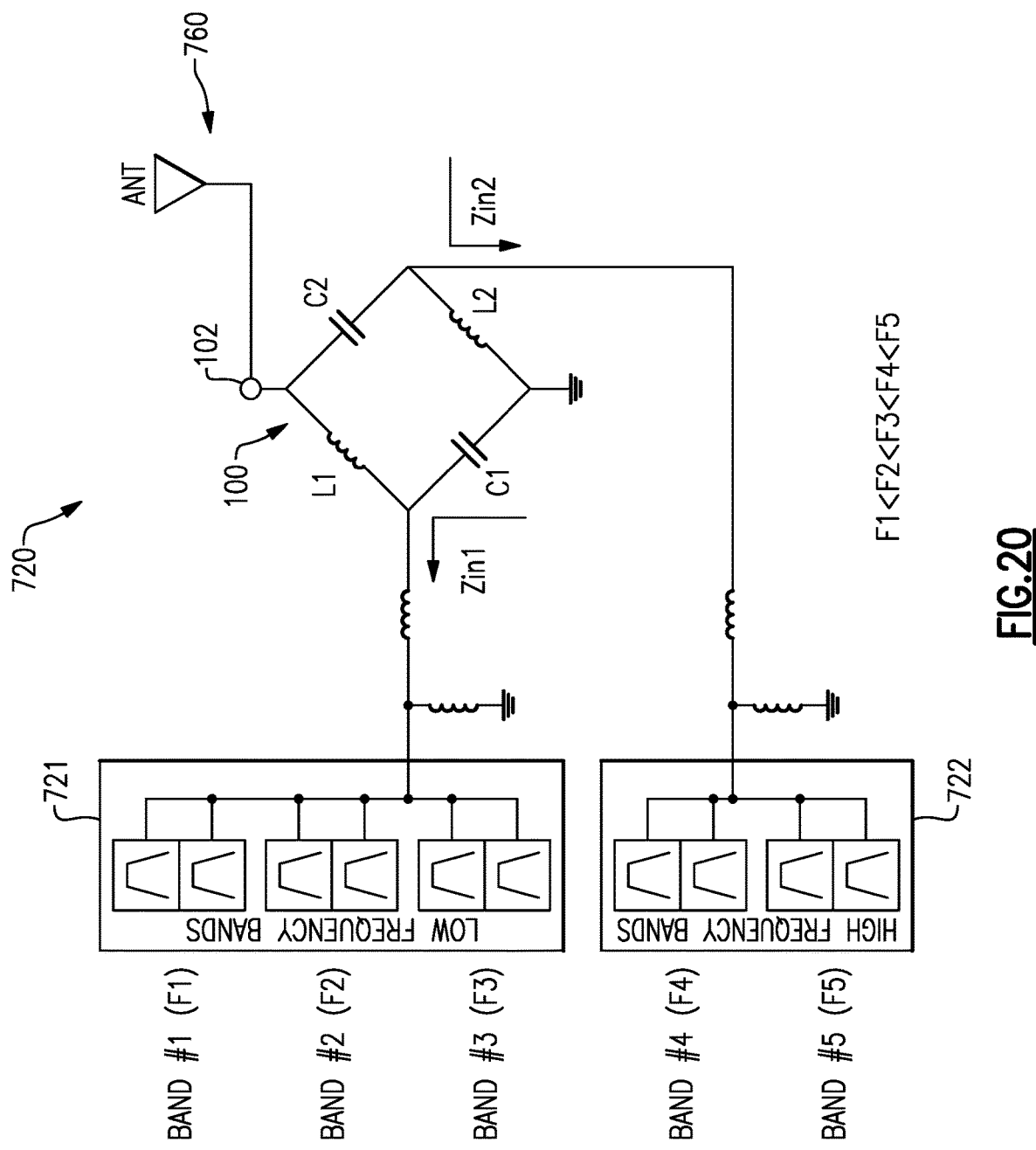
FIG. 20 shows an architecture that is a more specific example of the architecture of FIG. 4, utilizing the coupling circuit of FIG. 16.

FIG. 20 shows an architecture 720 that is a more specific example of the architecture 720 of FIG. 4, utilizing the coupling circuit 100 of FIG. 16. In the example of FIG. 20, a first group of filters 721 is shown to include three low frequency band duplexers, each having respective transmit (Tx) and receive (Rx) filters, for three bands F1, F2, F3. Thus, the first group of filters 721 includes three Rx filters for F1_Rx, F2_Rx, F3_Rx bands, and three Tx filters for F1_Tx, F2_Tx, F3_Tx bands. Similarly, a second group of filters 722 is shown to include two high frequency band duplexers, each having respective transmit (Tx) and receive (Rx) filters, for two bands F4, F5. Thus, the second group of filters 722 includes two Rx filters for F4_Rx, F5_Rx bands, and two Tx filters for F4_Tx, F5_Tx bands. For the purpose of description of the example of FIG. 20, it will be assumed that the frequency bands F1, F2, F3, F4, F5 have successively higher frequency values (e.g., middle-frequency value in a given band), such that F1<F2<F3<F4<F5.

In the example of FIG. 20, the coupling circuit 100 is shown to include a common signal node 102 that is between an inductance L1 and a capacitance C2. The common signal node 102 is shown to be coupled to an antenna 760. A first node between the inductance L1 and a capacitance C1 is shown to be coupled to the first group of filters 721, so as to be presented with a first impedance Zin1. A second node between the capacitance C2 and an inductance L2 is shown to be coupled to the second group of filters 722, so as to be presented with a second impedance Zin2. A node between the capacitance C1 and the inductance L2 is shown to be coupled to a ground.

Referring to the example of FIG. 20, suppose that a receive operation involves a signal being received through the antenna 760, and a selected Rx filter in each of the first and second groups 721, 722 is coupled to the coupling circuit 100 for carrier aggregation. In such an example context, each of such selected filters can be configured such that impedances Zin1 and Zin2 associated with the coupling circuit 100 are as described herein in reference to FIGS. 4 and 6. Accordingly, FIG. 21 shows scans of Zin1 and Zin2 impedances for the example architecture 720 of FIG. 20, showing various complex part-conjugate nature of Zin1 and Zin2 for each band.

Figure 22:
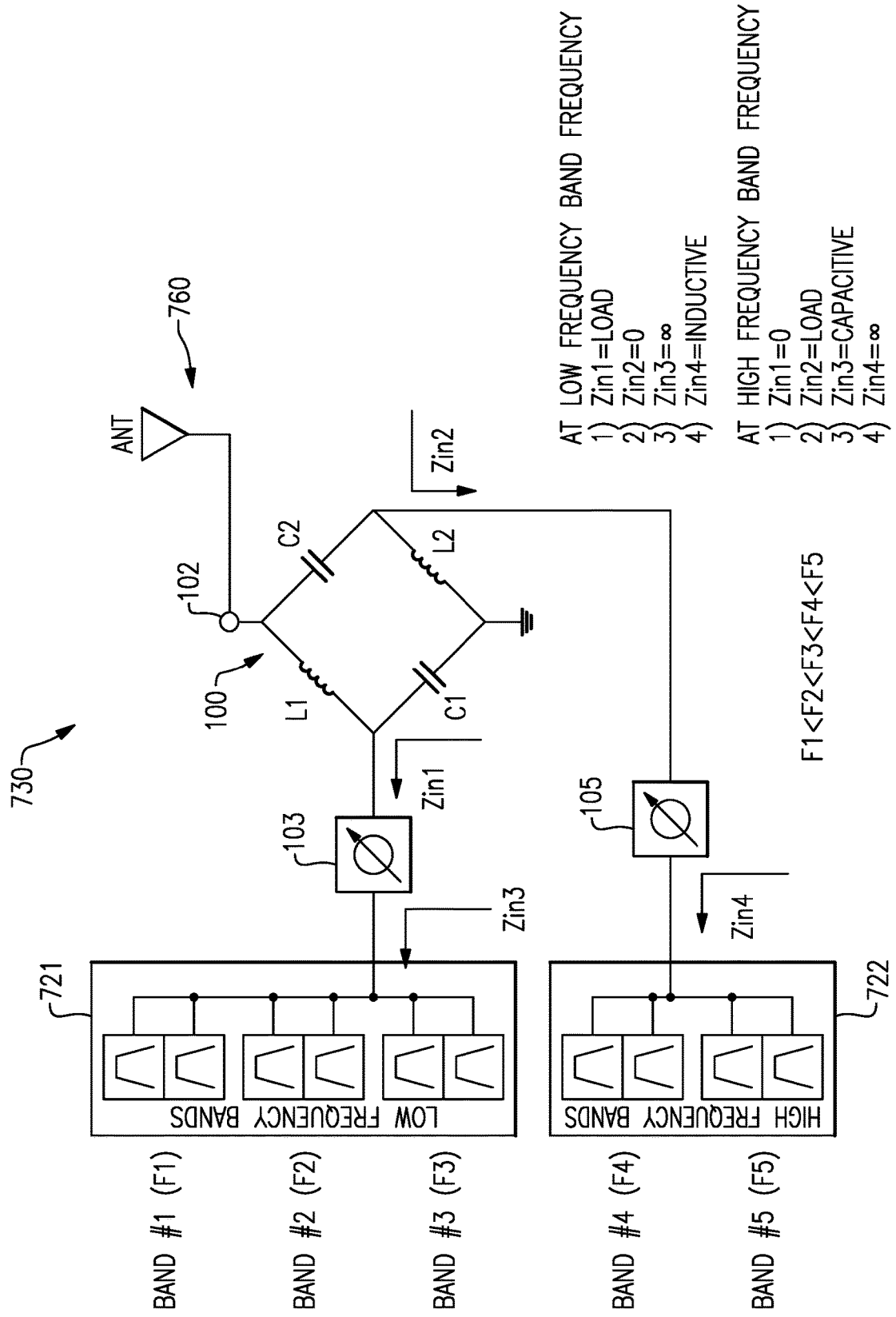
FIG. 22 shows an example of how phase shifting functionality can be utilized in an architecture that includes a coupling circuit as described herein.
Figure 23:
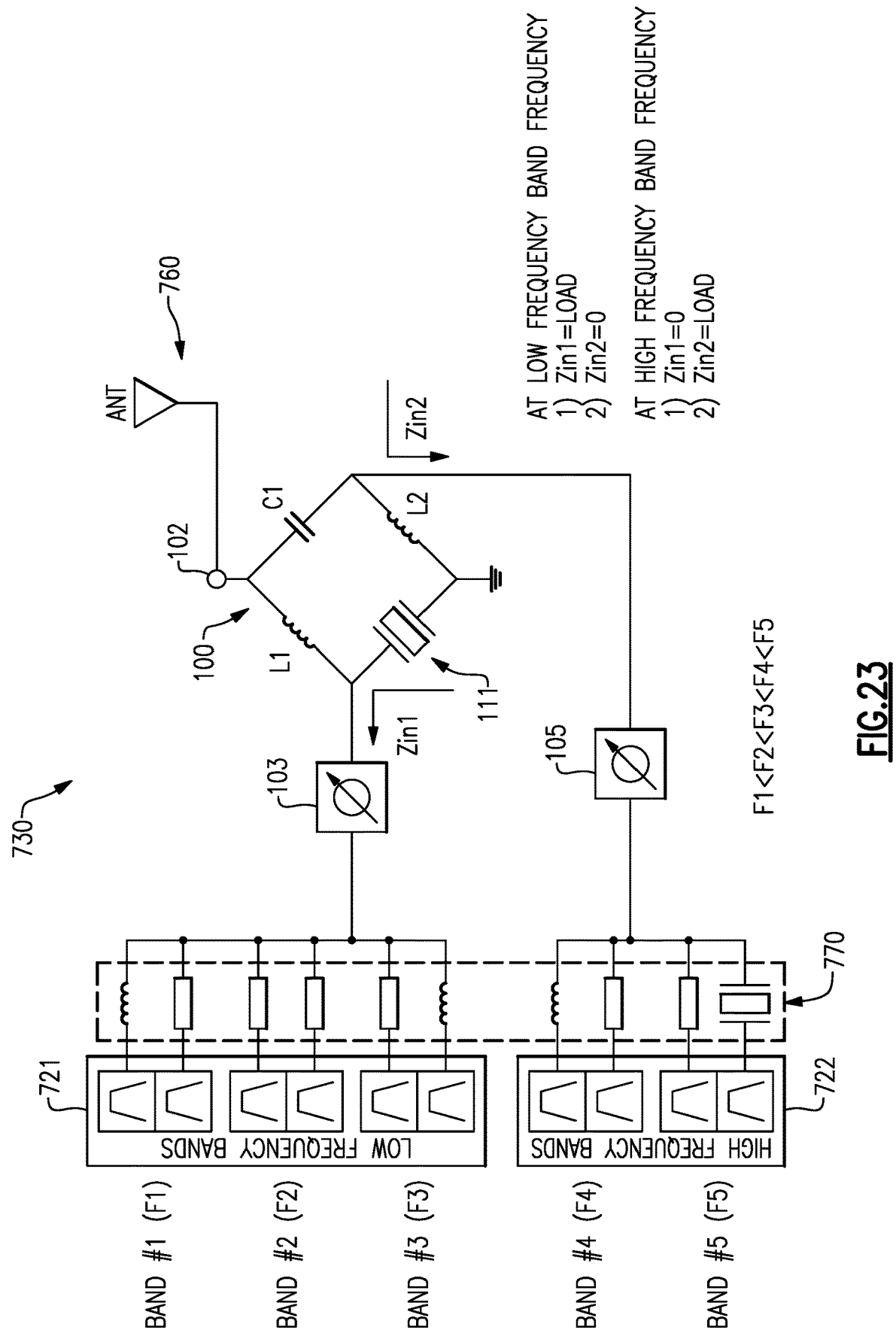
FIG. 23 shows another example of how phase shifting functionality can be utilized in an architecture that includes a coupling circuit as described herein.

FIGS. 22 and 23 show examples of how phase shifting functionality can be utilized in architectures that include a coupling circuit as described herein. For example, FIG. 22 shows an architecture 730 that is similar to the architecture 720 of FIG. 20, but in which one or more phase shifters can be utilized to better isolate a group of bands from one or more other groups of bands.

In the example of FIG. 22, a first group of filters 721 is shown to include three low frequency band duplexers, and a second group of filters 722 is shown to include two high frequency band duplexers, similar to the example of FIG. 20. For such groups of filters (e.g., low frequency band filters for bands F1, F2, F3, and high frequency band filter for bands F4, F5), impedances Zin1 and Zin2 can be similar to the example of FIGS. 20 and 21.

In the example of FIG. 22, a first phase shifter 103 can be implemented between the coupling circuit 100 and the first group of filters 721, and a second phase shifter 105 can be implemented between the coupling circuit 100 and the second group of filters 722. Such first and second phase shifters can be configured to provide improved isolation between a third group of filters (e.g., mid frequency bands)

and each of the first and second groups 721, 722. For example, the phase shifter 103 can provide a shift in phase, such that an impedance Zin3 after the phase shifter 103 is approximately an open circuit impedance for a mid frequency band signal, and a capacitive impedance for a high frequency band signal. The phase shifter 105 can provide a shift in phase, such that an impedance Zin4 after the phase shifter 105 is approximately an open circuit impedance for the mid frequency band signal, and an inductive impedance for a low frequency band signal. It is noted that the foregoing phase shifting configuration minimizes or reduces mutual loading between the mid frequency band and the high frequency band.

In another example, FIG. 23 shows an architecture 730 that is similar to the architecture 730 of FIG. 22, but in which phase shifting functionality can be implemented to be band-specific for at least some of the bands supported by first and second groups of filters 721, 722. In some embodiments, phase shifting elements 770 such as transmission lines, L/C components and/or resonators can be configured for band-specific implementations. In some embodiments, such band-specific phase shifting functionality can result in improved performance of the coupling circuit 100.

For example, for the first group of filters 721 in the architecture 730 of FIG. 23, an inductance element and a transmission line can be configured and implemented for the Tx and Rx filters of the first band (F1), transmission lines can be configured and implemented for both of the Tx and Rx filters of the second band (F1), and a transmission line and an inductance element can be configured and implemented for the Tx and Rx filters of the third band (F3).

For the second group of filters 722 in the architecture 730 of FIG. 23, an inductance element and a transmission line can be configured and implemented for the Tx and Rx filters of the first band (F4), and a transmission line and a resonator can be configured and implemented for the Tx and Rx filters of the second band (F5).

FIG. 23 also shows that in some embodiments, a phase shifting element, such as a resonator, can be implemented as a part of a coupling circuit. For example, the coupling circuit 100 is shown to include a resonator 111 implemented to replace a capacitance (e.g., C1 in FIG. 22). In some embodiments, the resonator 111 of the coupling circuit 100 and the resonator associated with the band-specific phase shifting elements 770 can be configured to function operatively to provide improved functionality of the coupling circuit.

In some embodiments, each of the foregoing resonators can be implemented as, for example, an acoustic resonator such as a bulk acoustic wave (BAW) resonator or a surface acoustic wave (SAW) resonator (e.g., a temperature-compensated (TC) SAW resonator).

Figure 24:
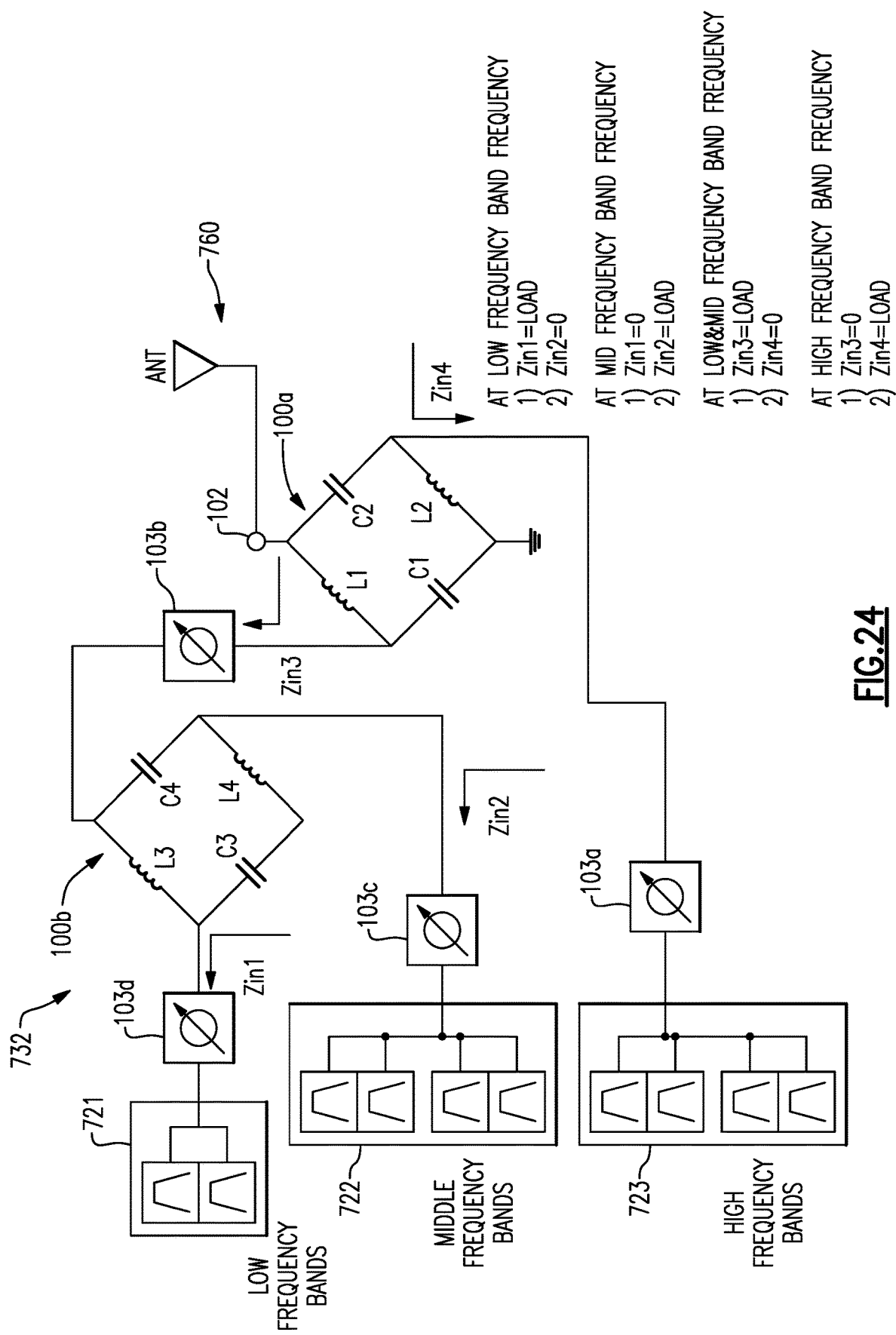
FIG. 24 shows an architecture that can be a more specific example of the architecture of FIG. 8, where a plurality of coupling circuits can be utilized.

FIG. 24 shows an architecture 732 that can be a more specific example of the architecture 732 of FIG. 8, where a plurality of coupling circuits can be utilized. In the example of FIG. 24, a first group of filters 721 is shown to include one low frequency band duplexer, a second group of filters 722 is shown to include two mid frequency band duplexers, and a third group of filters 723 is shown to include two high frequency band duplexers.

Referring to FIG. 24, the architecture 732 is shown to include a first coupling circuit 100a having a common signal node 102 coupled to an antenna 760, a first path coupled to a common signal node (between L3 and C4) of a second coupling circuit 100b (from a node between L1 and C1), and a second path coupled to the third group of filters 723 (from a node between C2 and L2). The second coupling circuit 100b is shown to have its first path coupled to the first group of filters 721 (from a node between L3 and C3) and its second path coupled to the second group of filters 722 (from a node between C4 and L4).

Configured in the foregoing manner, an impedance of Zin3 is presented in the first path of the first coupling circuit 100a, and an impedance of Zin4 is presented in the second path of the first coupling circuit 100a. Similarly, an impedance of Zin1 is presented in the first path of the second coupling circuit 100b, and an impedance of Zin2 is presented in the second path of the second coupling circuit 100b.

In the example of FIG. 24, a group of filters associated with the first path of the first coupling circuit 100a can be considered to include the filters of the low frequency bands (721) and the filters of the mid frequency bands (722). Accordingly, the impedance Zin3 can have a value that is at or close to a load-matched impedance for low and mid frequency bands, and a value that is at or close to a short circuit state for high frequency bands. The impedance Zin4 can have a value that is at or close to a load-matched impedance for high frequency bands, and a value that is at or close to a short circuit state for low and mid frequency bands.

Also in the example of FIG. 24, the second coupling circuit 100b is shown to support the low frequency band filters 721 and the mid frequency band filters 722 through its first and second paths. Accordingly, the impedance Zin1 can have a value that is at or close to a load-matched impedance for low frequency bands, and a value that is at or close to a short circuit state for mid frequency bands. The impedance Zin2 can have a value that is at or close to a load-matched impedance for mid frequency bands, and a value that is at or close to a short circuit state for low frequency bands.

In the example of FIG. 24, a phase shifter is shown to be provided for each path of each coupling circuit. More particularly, phase shifters 103b, 103a are shown to be provided for the first and second paths of the first coupling circuit 100a, and phase shifters 103d, 103c are shown to be provided for the first and second paths of the second coupling circuit 100b. In some embodiments, such phase shifters can be selected to provide one or more desirable functionalities as described herein. It will be understood that in some embodiments, an architecture similar to the example of FIG. 24 may include none of such phase shifters, some of such phase shifters, or all of such phase shifters.

Figure 25:
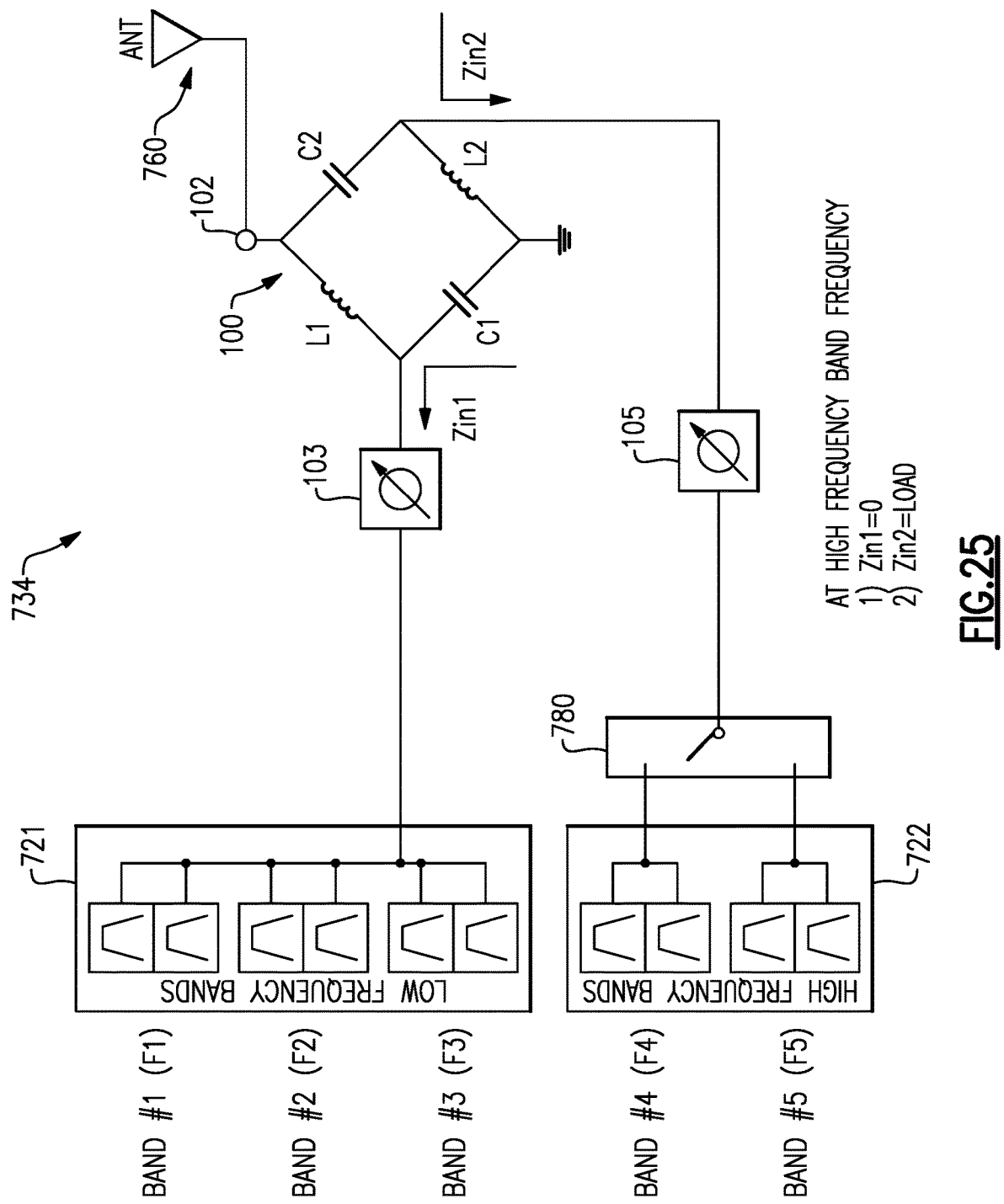
FIG. 25 show an architecture that can be a more specific example of the architectures of FIGS. 9 and 12.

FIGS. 25-28 show examples of architectures having one or more switching functionalities described herein in reference to FIGS. 9-15. For example, FIG. 25 show an architecture 734 that can be a more specific example of the architectures 734 of FIGS. 9 and 12. In the example of FIG. 25, a coupling circuit 100 is shown to couple a common signal node 102 to a first group of filters 721 having three low frequency band duplexers (F1, F2, F3) through a first path, and to a second group of filters 722 having two high frequency band duplexers (F4, F5) through a second path. Such a second path is shown to include a switch 780 configured to allow selection of a high frequency band (F4 or F5) among the bands of the second group 722.

Figure 26:
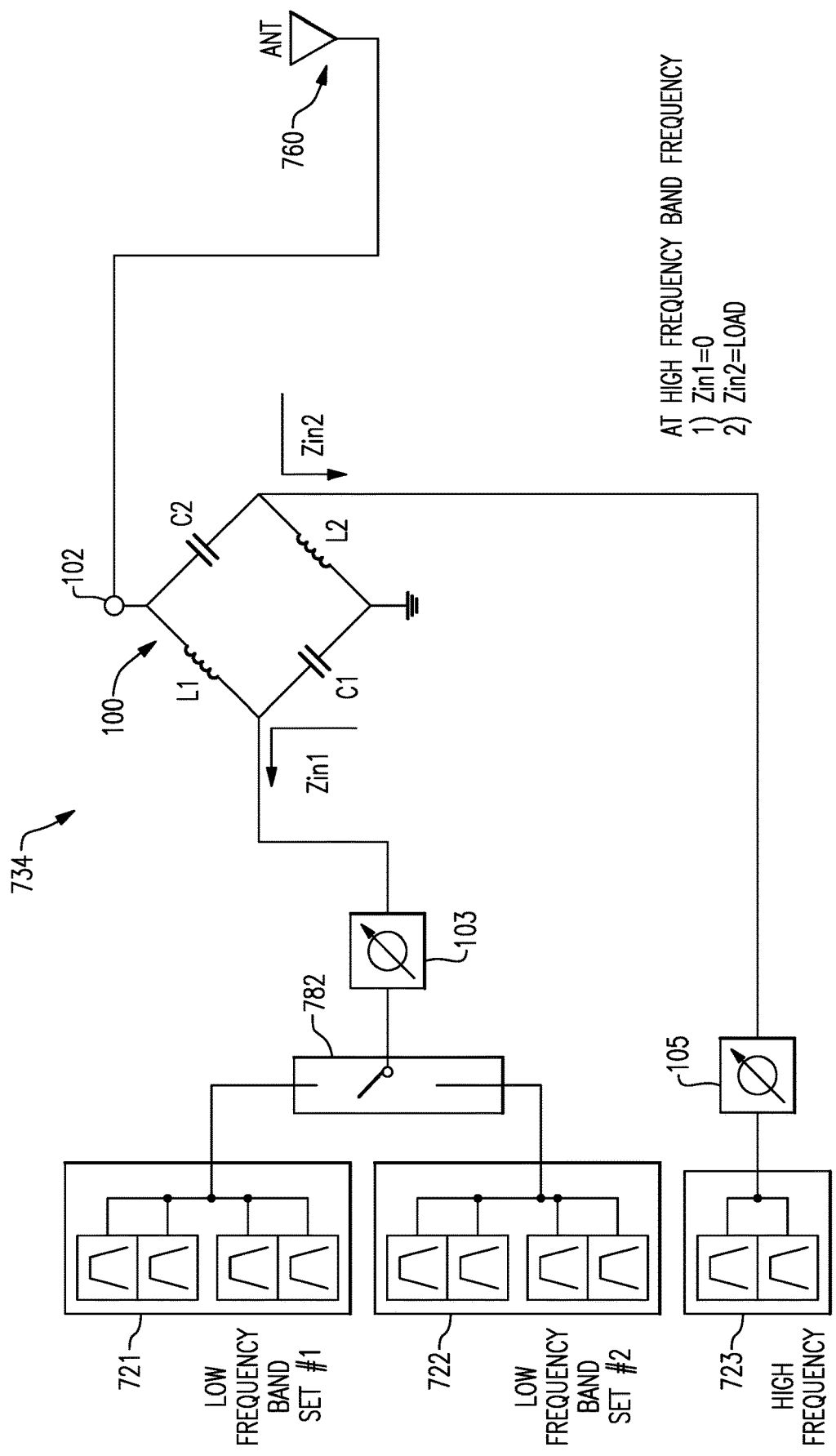
FIG. 26 show an architecture that can be a more specific example of the architectures of FIGS. 9 and 13.

In another example, FIG. 26 show an architecture 734 that can be a more specific example of the architectures 734 of FIGS. 9 and 13. In the example of FIG. 26, a coupling circuit 100 is shown to couple a common signal node 102 to a first group of filters 721 (having two low frequency band duplexers) or a second group of filters 722 (having two low frequency band duplexers), through a first path, and to a third group of filters 723 (having a high frequency band duplexer) through a second path. The first path is shown to include a switch 782 configured to allow selection of the first group of filters 721 or the second group of filters 722.

Figure 27:
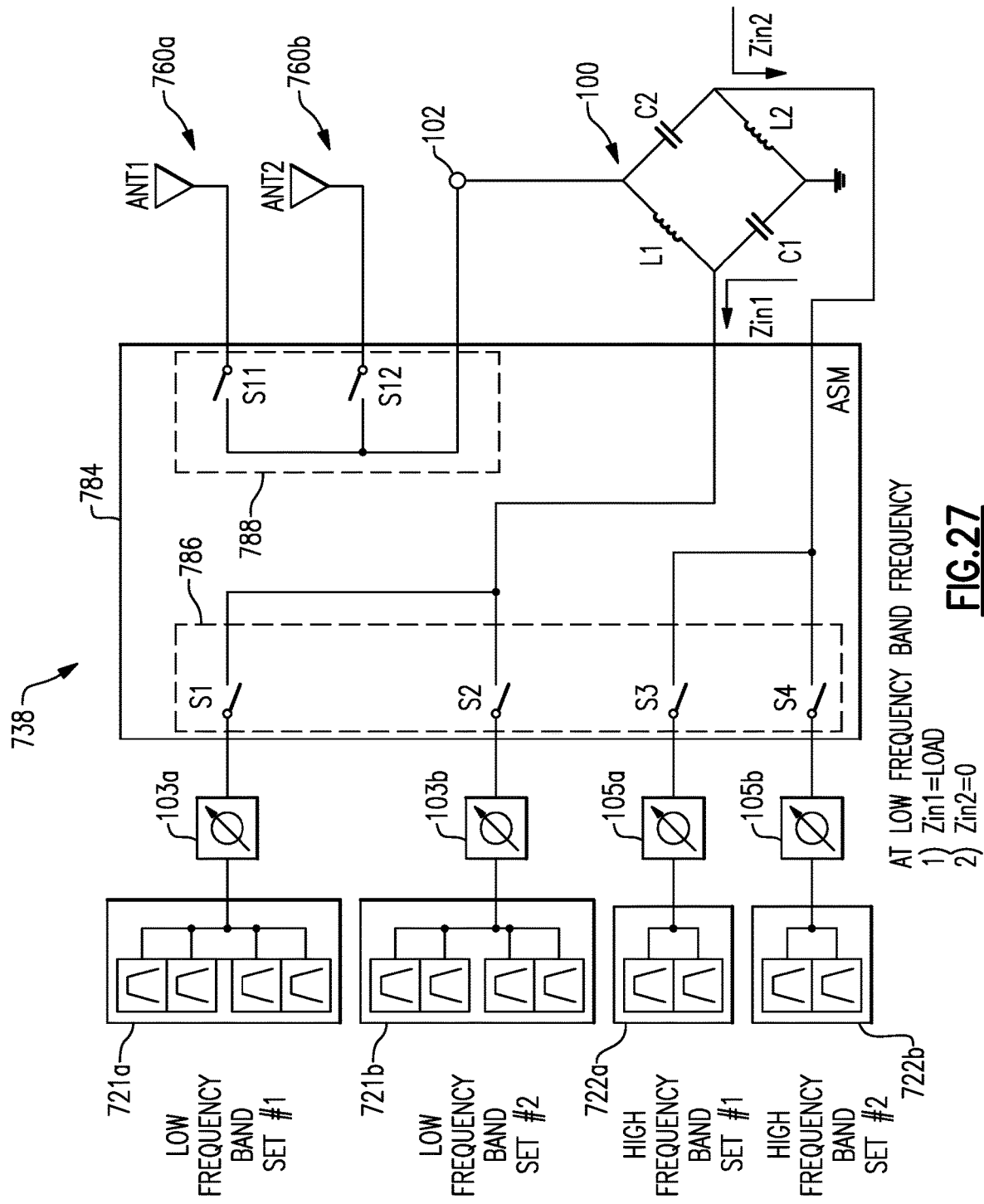
FIG. 27 shows an architecture having switching functionalities described herein in reference to FIGS. 11, 13 and 14.

In yet another example, FIG. 27 shows an architecture 738 having switching functionalities described herein in reference to FIGS. 11, 13 and 14. In the example of FIG. 27, a first group of low frequency band filters 721*a* is shown to include two low frequency band duplexers, and a second group of low frequency band filters 721*b* is shown to include two low frequency band duplexers. A first group of high frequency band filters 722*a* is shown to include a high frequency band duplexer, and a second group of high frequency band filters 722*b* is shown to include a high frequency band duplexer. Accordingly, such groups of filters can be grouped into a first group having low frequency band duplexers (721*a* and 721*b*) coupled to a coupling circuit 100 through a first path, and a second group having high frequency band duplexers (722*a* and 722*b*) coupled to the coupling circuit 100 through a second path.

In the example of FIG. 27, a switching network 786 is shown to be implemented to provide switching functionalities between the coupling circuit 100 and the foregoing first and second groups of filters. More particularly, switches S1 and S2 of the switching network 786 can be operated to provide coupling of the first group of low frequency band filters 721*a* or the second group of low frequency band filters 721*b* to the coupling circuit 100 (through the first path). Similarly, switches S3 and S4 of the switching network 786 can be operated to provide coupling of the first group of high frequency band filters 722*a* or the second group of high frequency band filters 722*b* to the coupling circuit 100 (through the second path).

In the example of FIG. 27, a switching network 788 is shown to be implemented to allow a common signal node 102 of the coupling circuit 100 to be coupled to a first antenna 760*a* or to a second antenna 760*b*. For example, a switch S11 can be closed and a switch S12 can be opened to couple the common signal node 102 to the first antenna 760*a*. Similarly, the switch S11 can be opened and the switch S12 can be closed to couple the common signal node 102 to the second antenna 760*b*.

Referring to the example of FIG. 27, it will be understood that the foregoing switching networks 786 and 788 can be implemented in a number of ways. In some embodiments, the switching networks 786 and 788 can be part of a switching circuit indicated as 784, and such a switching circuit can be implemented on, for example, a die or a module.

Figure 28:
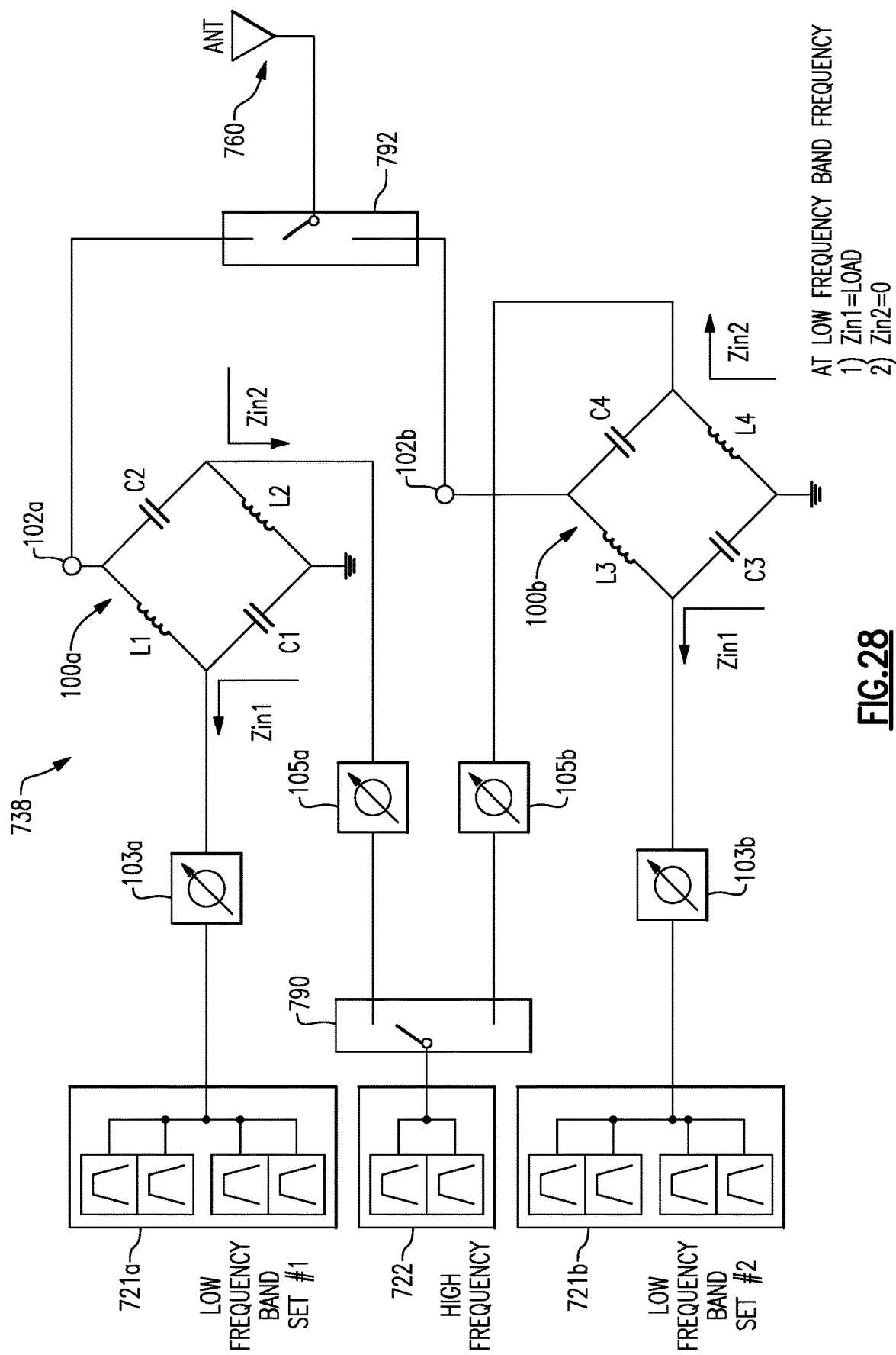
FIG. 28 shows an example architecture that includes switching functionalities to allow a plurality of coupling circuits to share a common antenna, and also to share a common group of filters.

FIG. 28 shows an example architecture 738 that includes switching functionalities to allow a plurality of coupling circuits 100*a*, 100*b* to share a common antenna 760, and also to share a common group of filters 722. Suppose that an architecture design includes carrier aggregation capability between low frequency bands and high frequency bands. If such low frequency bands span sufficiently wide range in frequency, it may be desirable to split the low frequency bands into two sub-groups of low frequency bands, and pair each sub-group with a group of the high frequency bands utilizing a respective coupling circuit.

Accordingly, in the example of FIG. 28, the common group of filters 722 can include one or more high frequency bands. The first sub-group of low frequency filters can be 721*a*, and the second sub-group of low frequency filters can be 721*b*. Configured in the foregoing manner, the first sub-group of filters 721*a* and the common group of filters 722 can be coupled to a common signal node 102*a* of the first coupling circuit 100*a* having appropriate values of L1, C1, C2, L2 selected to accommodate such groups of filters.

Similarly, the second sub-group of filters 721*b* and the common group of filters 722 can be coupled to a common signal node 102*b* of the second coupling circuit 100*b* having appropriate values of L3, C3, C4, L4 selected to accommodate such groups of filters. In some embodiments, phase shifters 103*a*, 105*a*, 103*b*, 105*b* can be provides as shown and configured to provide desirable shifts in phases for improved performance.

Referring to the example of FIG. 28, a low-band/high-band carrier aggregation can involve the first sub-group 721*a* or the second sub-group 721*b*. Accordingly, if the first sub-group 721*a* is being utilized, a switch 790 can allow the second path of the first coupling circuit 100*a* to be connected to the common group of filters 722, and the second path of the second coupling circuit 100*b* to be disconnected from the common group of filters 722. Similarly, if the second sub-group 721*b* is being utilized, the switch 790 can allow the second path of the first coupling circuit 100*a* to be disconnected from the common group of filters 722, and the second path of the second coupling circuit 100*b* to be connected to the common group of filters 722.

In the example of FIG. 28, the architecture 738 is shown to utilize a common antenna 760. Accordingly, if the first coupling circuit 100*a* is being utilized, its common signal node 102*a* can be coupled to the antenna 760 by a switch 792, and a common signal node 102*b* of the second coupling circuit 100*b* can be uncoupled from the antenna 760 by the switch 792. Similarly, if the second coupling circuit 100*b* is being utilized, its common signal node 102*b* can be coupled to the antenna 760 by the switch 792, and a common signal node 102*a* of the first coupling circuit 100*a* can be uncoupled from the antenna 760 by the switch 792.

Figure 29:
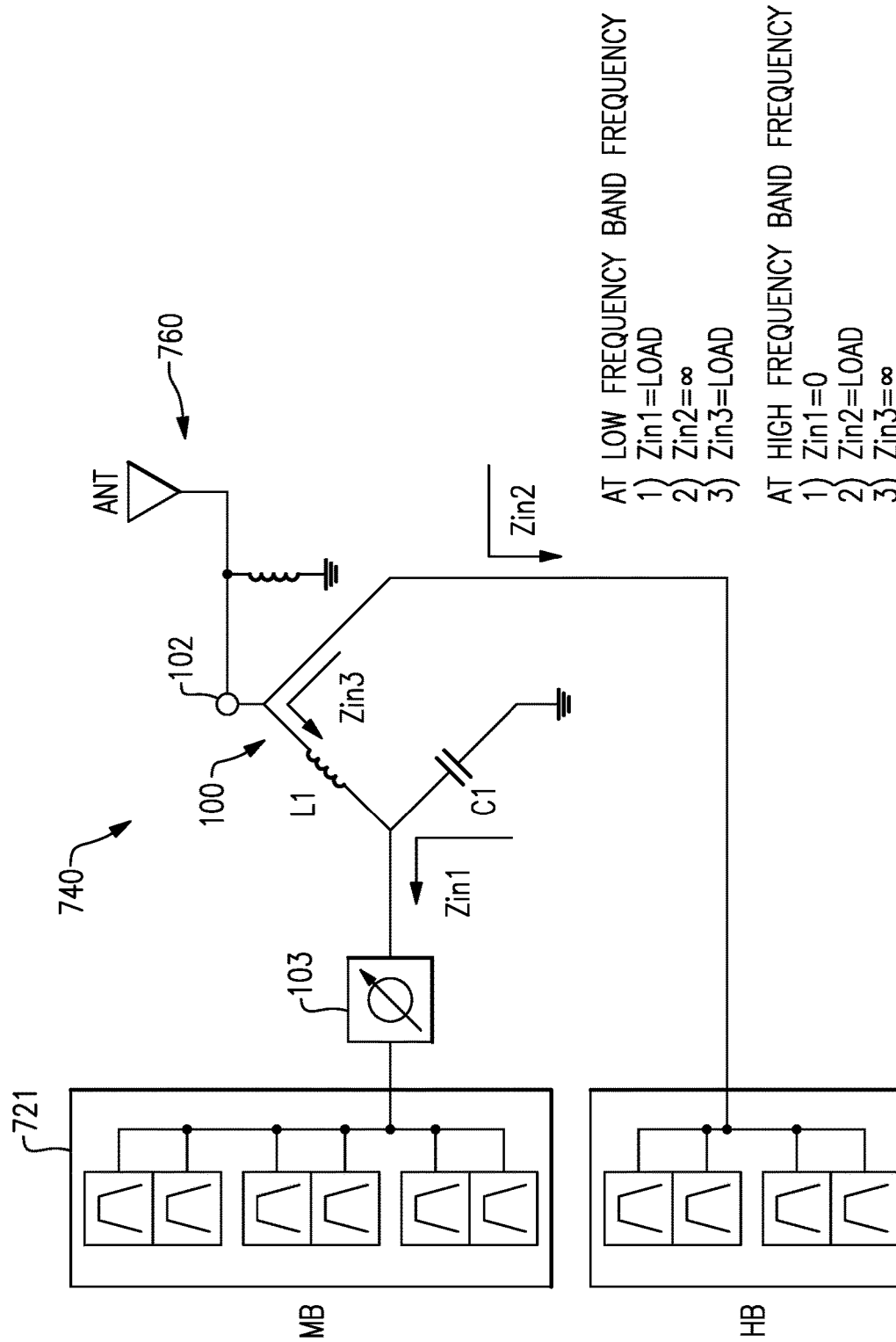
FIG. 29 shows an architecture that can be a more specific example of the architecture of FIG. 19A.

FIG. 29 shows an architecture 740 that can be a more specific example of the architecture 740 of FIG. 19A. In the example of FIG. 29, the architecture 740 is shown to include a first group of filters 721 having three mid frequency band duplexers and a second group of filters 722 having two high frequency band duplexers. A half-bridge coupling circuit 100 is shown to have its common signal node 102 coupled to an antenna 760. A node between L1 and C1 of the coupling circuit 100 is shown to be coupled to the first group of filters 721 through a phase shifter 103. The second group of filters 722 is shown to be coupled to the common signal node 102.

Configured in the foregoing manner, impedance Zin1 is presented by the first path to the first group of filters 721, impedance Zin2 is presented by the second path to the second group of filters 722, and impedance Zin3 is presented to the common signal node 102 by the inductance L1. Accordingly, at a mid band frequency (for one of the mid frequency bands of the group 721), each of Zin1 and Zn3 has a value at or close to a matched load impedance, and Zin2 has an open circuit value. At a high band frequency (for one of the high frequency bands of the group 722), Zin2 has a value at or close to a matched load impedance, Zin1 has a short circuit value, and Zn3 has an open circuit value.

Figure 30:
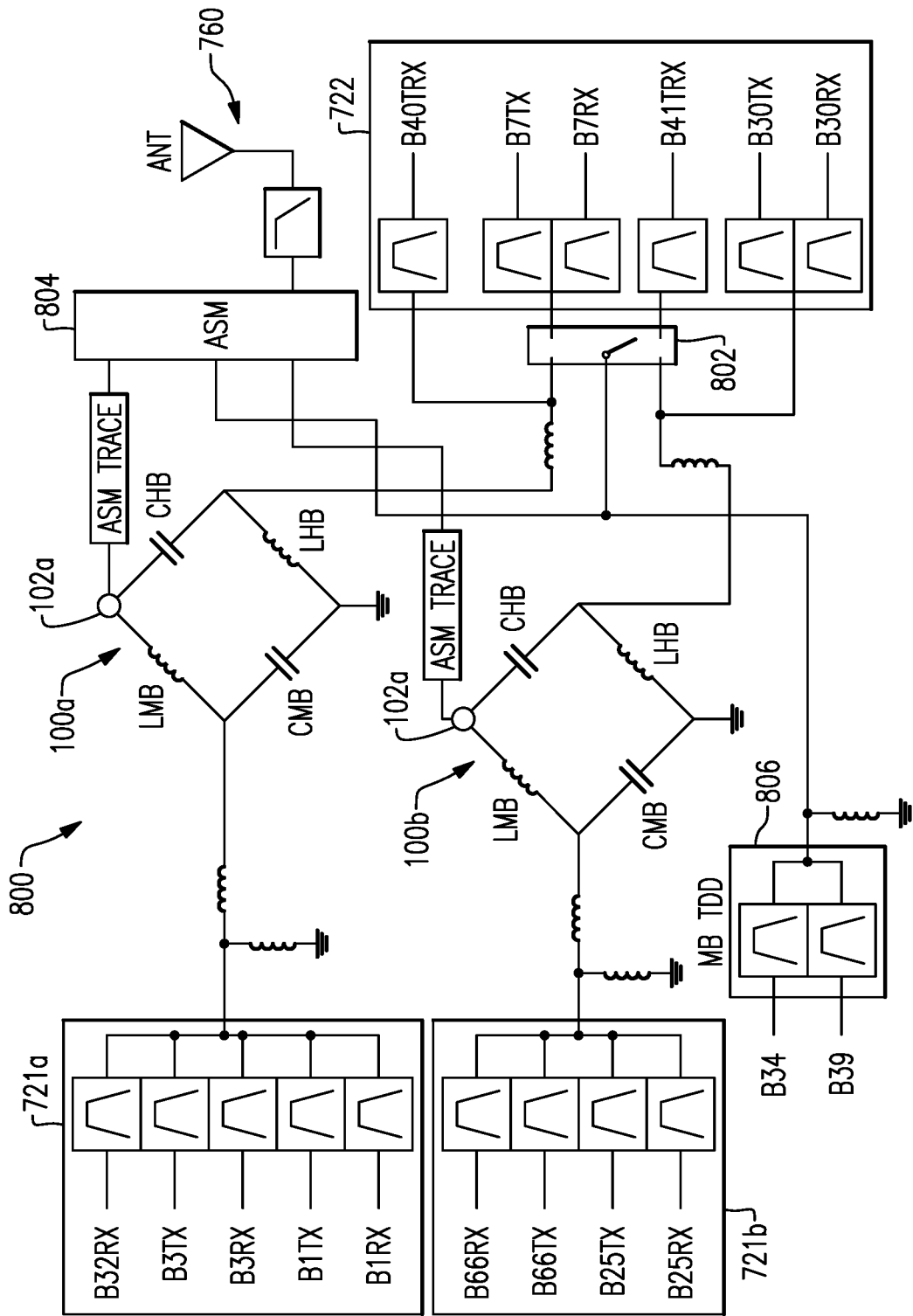
FIG. 30 shows an example architecture that utilizes a number of features described herein.

FIG. 30 shows an example architecture 800 that utilizes a number of features described herein. In the example of FIG. 30, two coupling circuits 100*a*, 100*b* are shown to provide couplings between a common antenna 760 and respective groups of filters. More particularly, the first coupling circuit 100*a* is shown to provide coupling between the antenna 760 and groups of filters 721*a*, 722; and the second coupling circuit 100*b* is shown to provide coupling between the antenna 760 and groups of filters 721*b*, 722.

Referring to FIG. 30, the group of filters 721*a* is shown to include a number of mid frequency band filters including duplexers for B3Tx/B3Rx and B1Tx/B1Rx bands, and a B32Rx band filter. The group of filters 721b is shown to include a number of mid frequency band filters including duplexers for B66Tx/B66Rx and B25Tx/B25Rx bands. The group of filters 722 is shown to include a number of high frequency band filters including a duplexers for B7Tx/B7Rx and B30Tx/B30Rx bands, and filters B40TRx and B41TRx configured to support Tx and Rx operations in respective bands. Accordingly, the foregoing grouping of filters utilizes at least some of the features of the example of FIG. 28, where a plurality of coupling circuits can be utilized to accommodate splitting of a group of filters (low frequency band filters in FIG. 28, and mid frequency band filters in FIG. 30) into sub-groups of filters.

Accordingly, in the example of FIG. 30, the first coupling circuit 100a can include inductances LMB, LHB and capacitances CMB, CHB as shown to support the foregoing mid frequency band and high frequency band filters. Similarly, the second coupling circuit 100b can include inductances LMB, LHB and capacitances CMB, CHB as shown to support the foregoing mid frequency band and high frequency band filters. It will be understood that each of LMB, LHB, CMB, CHB of the first coupling circuit 100a may or may not have the same value as respective one of LMB, LHB, CMB, CHB of the second coupling circuit 100b.

In the example of FIG. 30, the architecture 800 is configured to allow at least some of the filters of the group 722 to be shared between the first and second coupling circuits 100a, 100b. More particularly, a switch 802 can allow the B7Tx/B7Rx duplexer and the B41TRx filter to be coupled to the second path of the first coupling circuit 100a, or to the second path of the second coupling circuit 100b.

In the example of FIG. 30, a switching circuit 804 (e.g., implemented as an antenna switching module (ASM)) can be configured to allow coupling of the antenna 760 to the first coupling circuit 100a or to the second coupling circuit 100b. More particularly, the common signal node 102a of the first coupling circuit 100a can be coupled to the antenna 760 by an appropriate operation of the switching circuit 804. Similarly, the common signal node 102b of the second coupling circuit 100b can be coupled to the antenna 760 by an appropriate operation of the switching circuit 804.

In the example of FIG. 30, the architecture 800 can include one or more circuits that do not utilize a coupling circuit. For example, a group of filters 806 can include time-domain duplexing (TDD) filters such as mid frequency bands B34 and B39. Such a group of filters is shown to be coupled to the antenna 760 through the switching circuit 804 without a coupling circuit. In some embodiments, some or all of such TDD bands can be individually, together with each other, with another FDD (frequency-domain duplexing) band (such as one or more filters of the group 722), or some combination thereof, utilizing the antenna 760.

In some embodiments, the architecture 800 of FIG. 30 can include phase shifting elements such as transmission lines, L/C components and/or resonators configured to provide desirable functionalities, including functionalities associated with either or both of the first and second coupling circuits 100a, 100b.

Figure 31:
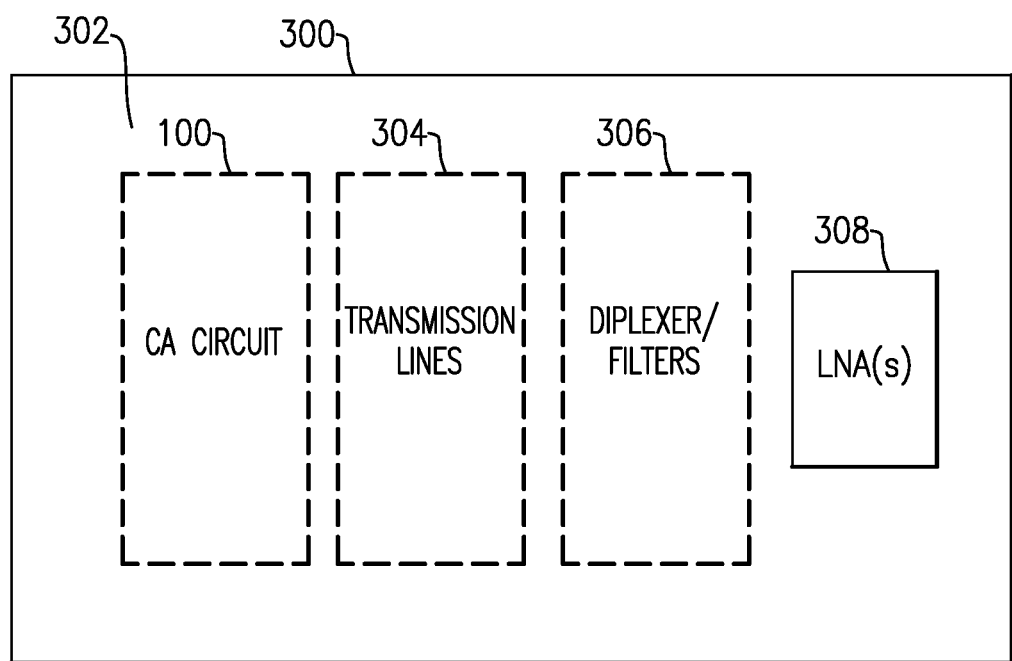
FIG. 31 shows that in some embodiments, a radio-frequency (RF) module can include one or more features as described herein.

FIG. 31 shows that in some embodiments, one or more features as described herein can be implemented in a radio-frequency (RF) module 300 (e.g., a front-end module or an LNA module). The module 300 can include a packaging substrate 302 such as a laminate substrate. Such a module can include one or more LNAs 308. At least one of such LNAs can be configured to operate in a CA mode as described herein.

The module 300 can further include a carrier aggregation (CA) circuit 100 having one or more features as described herein. Such a CA circuit can be configured to provide CA functionality for the LNA 308 through a diplexer/filter assembly 306. Transmission lines 304 can be configured to, for example, provide desired phase shifts in various signal paths, including those associated with inputs and output(s) of the diplexer/filter assembly 306. Although not shown, the module 300 can further include grounding switches for the CA circuit 100 to facilitate CA and non-CA operations as described herein.

In some implementations, an architecture, device and/or circuit having one or more features described herein can be included in an RF device such as a wireless device. Such an architecture, device and/or circuit can be implemented directly in the wireless device, in one or more modular forms as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc. Although described in the context of wireless devices, it will be understood that one or more features of the present disclosure can also be implemented in other RF systems such as base stations.

Figure 32:
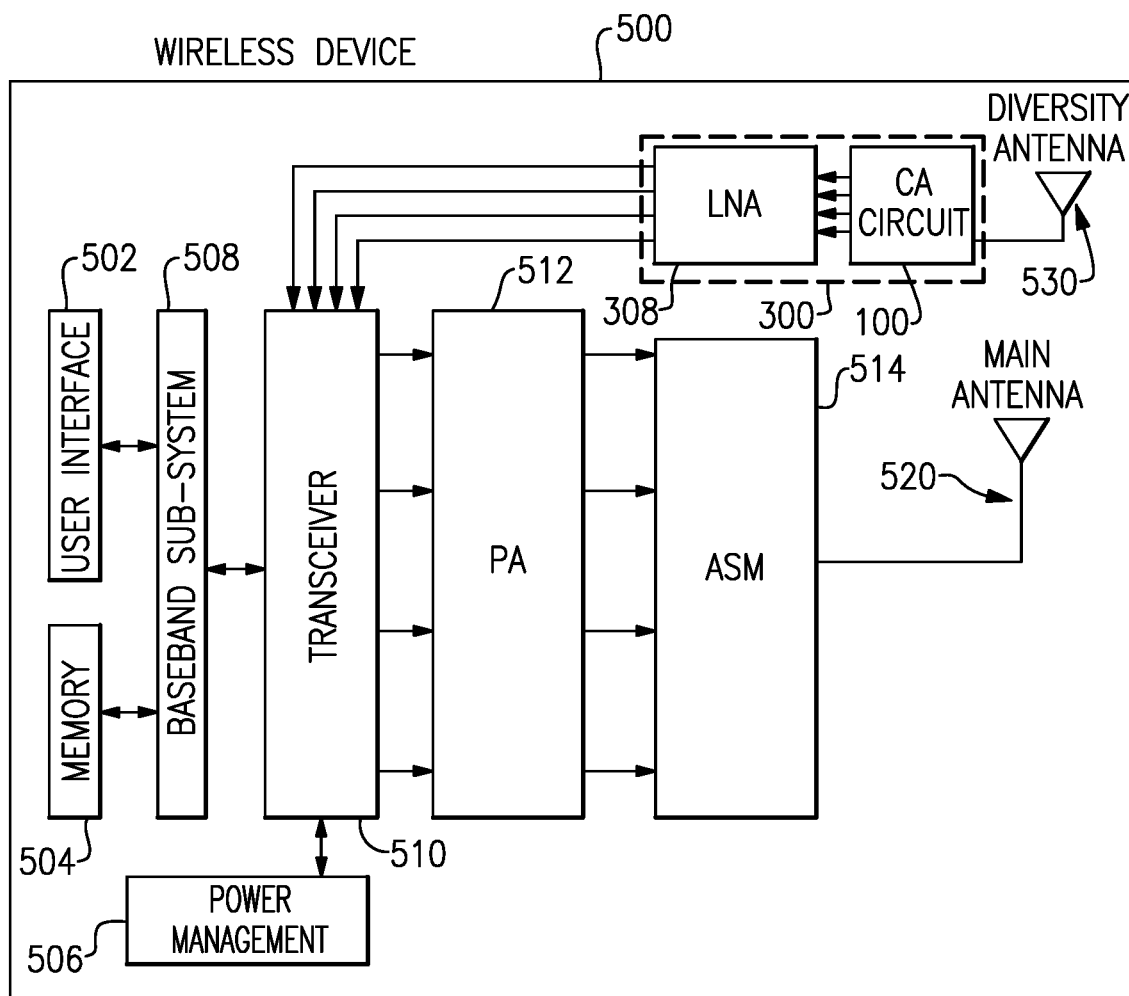
FIG. 32 depicts an example wireless device having one or more advantageous features described herein.

FIG. 32 depicts an example wireless device 500 having one or more advantageous features described herein. In some embodiments, such advantageous features can be implemented in a front-end (FE) or LNA module 300 as described herein. Such a module can include a CA circuit 100 having one or more features as described herein. In some embodiments, such module can include more or less components than as indicated by the dashed box.

PAs in a PA module 512 can receive their respective RF signals from a transceiver 510 that can be configured and operated to generate RF signals to be amplified and transmitted, and to process received signals. The transceiver 510 is shown to interact with a baseband sub-system 508 that is configured to provide conversion between data and/or voice signals suitable for a user and RF signals suitable for the transceiver 510. The transceiver 510 is also shown to be connected to a power management component 506 that is configured to manage power for the operation of the wireless device 500. Such power management can also control operations of the baseband sub-system 508 and other components of the wireless device 500.

The baseband sub-system 508 is shown to be connected to a user interface 502 to facilitate various input and output of voice and/or data provided to and received from the user. The baseband sub-system 508 can also be connected to a memory 504 that is configured to store data and/or instructions to facilitate the operation of the wireless device, and/or to provide storage of information for the user.

In the example wireless device 500, the module 300 can include one or more carrier aggregation-capable signal paths configured to provide one or more functionalities as described herein. In some embodiments, at least some of the signals received through a diversity antenna 530 can be routed to one or more low-noise amplifiers (LNAs) 308 through such carrier aggregation-capable signal path(s). Amplified signals from the LNAs 308 are shown to be routed to the transceiver 510.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

One or more features of the present disclosure can be implemented with various cellular frequency bands as described herein. Examples of such bands are listed in Table 1. It will be understood that at least some of the bands can be divided into sub-bands. It will also be understood that one or more features of the present disclosure can be implemented with frequency ranges that do not have designations such as the examples of Table 1.

TABLE 1

| Band | Mode | Tx Frequency Range (MHz) | Rx Frequency Range (MHz) |
|---|---|---|---|
| B1 | FDD | 1,920-1,980 | 2,110-2,170 |
| B2 | FDD | 1,850-1,910 | 1,930-1,990 |
| B3 | FDD | 1,710-1,785 | 1,805-1,880 |
| B4 | FDD | 1,710-1,755 | 2,110-2,155 |
| B5 | FDD | 824-849 | 869-894 |
| B6 | FDD | 830-840 | 875-885 |
| B7 | FDD | 2,500-2,570 | 2,620-2,690 |
| B8 | FDD | 880-915 | 925-960 |
| B9 | FDD | 1,749.9-1,784.9 | 1,844.9-1,879.9 |
| B10 | FDD | 1,710-1,770 | 2,110-2,170 |
| B11 | FDD | 1,427.9-1,447.9 | 1,475.9-1,495.9 |
| B12 | FDD | 699-716 | 729-746 |
| B13 | FDD | 777-787 | 746-756 |
| B14 | FDD | 788-798 | 758-768 |
| B15 | FDD | 1,900-1,920 | 2,600-2,620 |
| B16 | FDD | 2,010-2,025 | 2,585-2,600 |
| B17 | FDD | 704-716 | 734-746 |
| B18 | FDD | 815-830 | 860-875 |
| B19 | FDD | 830-845 | 875-890 |
| B20 | FDD | 832-862 | 791-821 |
| B21 | FDD | 1,447.9-1,462.9 | 1,495.9-1,510.9 |
| B22 | FDD | 3,410-3,490 | 3,510-3,590 |
| B23 | FDD | 2,000-2,020 | 2,180-2,200 |
| B24 | FDD | 1,626.5-1,660.5 | 1,525-1,559 |
| B25 | FDD | 1,850-1,915 | 1,930-1,995 |
| B26 | FDD | 814-849 | 859-894 |
| B27 | FDD | 807-824 | 852-869 |
| B28 | FDD | 703-748 | 758-803 |
| B29 | FDD | N/A | 716-728 |
| B30 | FDD | 2,305-2,315 | 2,350-2,360 |
| B31 | FDD | 452.5-457.5 | 462.5-467.5 |
| B33 | TDD | 1,900-1,920 | 1,900-1,920 |
| B34 | TDD | 2,010-2,025 | 2,010-2,025 |
| B35 | TDD | 1,850-1,910 | 1,850-1,910 |
| B36 | TDD | 1,930-1,990 | 1,930-1,990 |
| B37 | TDD | 1,910-1,930 | 1,910-1,930 |
| B38 | TDD | 2,570-2,620 | 2,570-2,620 |
| B39 | TDD | 1,880-1,920 | 1,880-1,920 |
| B40 | TDD | 2,300-2,400 | 2,300-2,400 |
| B41 | TDD | 2,496-2,690 | 2,496-2,690 |
| B42 | TDD | 3,400-3,600 | 3,400-3,600 |
| B43 | TDD | 3,600-3,800 | 3,600-3,800 |
| B44 | TDD | 703-803 | 703-803 |

It is noted that while various examples are described herein in the context of carrier aggregation of two or three bands, one or more features of the present disclosure can also be implemented in configurations involving carrier aggregation of different numbers of bands.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency architecture comprising:
   a first group of plurality of filters each configured to support a band such that a first frequency range covers the respective plurality of bands;
   a second group of one or more filters each configured to support a band such that a second frequency range covers the respective one or more bands, each filter of one of the first and second groups configured to provide an impedance at or near a short circuit impedance for a signal in each band of the other group, each filter of the other group configured to provide an approximately open circuit impedance for a signal in each band of the one of the first and second groups; and
   a coupling circuit including a common node and configured to couple the common node to one of the first and second groups through a first path and to couple the common node to the other group through a second path, the coupling circuit further configured such that the impedance provided by each filter of the one of the first and second groups for the signal in each band of the other group results in the signal being sufficiently excluded from the first path.

2. The radio-frequency architecture of claim 1 wherein the coupling circuit is further configured such that the approximately open circuit impedance provided by each filter of the other group for the signal in each band of the one of the first and second groups results in the signal being substantially excluded from the second path.

3. The radio-frequency architecture of claim 1 wherein the first group is the one of the first and second groups and supports a frequency range that is lower than a frequency range supported by the second group.

4. The radio-frequency architecture of claim 3 wherein the coupling circuit includes an LC circuit that couples the common node to ground, the LC circuit including an inductance L and a capacitance C in series such that the inductance L is between the common node and a first node and the capacitance C is between the first node and the ground, the first node being coupled to the first group through the first path.

5. The radio-frequency architecture of claim 4 wherein the coupling circuit is configured such that the common node is coupled to the second group through the second path.

6. The radio-frequency architecture of claim 1 wherein the second group supports a frequency range that is higher than a frequency range supported by the first group.

7. The radio-frequency architecture of claim 6 wherein the coupling circuit includes an LC circuit that couples the common node to ground, the LC circuit including a capacitance C and an inductance L in series such that the capacitance C is between the common node and a second node and the inductance L is between the second node and the ground, the second node being coupled to the second group through the second path.

8. The radio-frequency architecture of claim 7 wherein the coupling circuit is configured such that the common node is coupled to the first group through the first path.

9. The radio-frequency architecture of claim 1 wherein each of either or both of the first and second paths includes a phase shifter.

10. The radio-frequency architecture of claim 1 wherein the first path is coupled to the first group such that a first phase shifting element is provided between the first path and each of the plurality of filters.

11. The radio-frequency architecture of claim 10 wherein the second path is coupled to the second group such that a second phase shifting element is provided between the second path and each of the one or more filters.

12. The radio-frequency architecture of claim 10 wherein each first phase shifting element includes a transmission line, an LC component, or a resonator.

13. The radio-frequency architecture of claim 12 wherein the resonator includes an acoustic resonator.

14. The radio-frequency architecture of claim 1 wherein the coupling circuit includes a resonator.

15. The radio-frequency architecture of claim 1 further comprising a switching circuit implemented to provide a filter selection functionality along either or both of the first and second paths.

16. The radio-frequency architecture of claim 15 wherein the switching circuit includes a switch configured to allow selection of a filter among a plurality of filters within the same group such that the selected filter is coupled to the respective one of the first and second paths.

17. The radio-frequency architecture of claim 15 wherein the switching circuit includes a switch configured to allow coupling of a selected one of the first and second paths to the respective group or to a third group of one or more filters each configured to support a band such that a third frequency range covers the respective one or more bands.

18. The radio-frequency architecture of claim 15 wherein the switching circuit includes a switch configured to allow selection of an antenna among a plurality of antennas such that the selected antenna becomes coupled to the common node of the coupling circuit.

19. A packaged module comprising:
a packaging substrate configured to receive a plurality of components; and
a radio-frequency circuit implemented on the packaging substrate and including a first group of plurality of filters each configured to support a band such that a first frequency range covers the respective plurality of bands, and a second group of one or more filters each configured to support a band such that a second frequency range covers the respective one or more bands, each filter of one of the first and second groups configured to provide an impedance at or near a short circuit impedance for a signal in each band of the other group, each filter of the other group configured to provide an approximately open circuit impedance for a signal in each band of the one of the first and second groups, the radio-frequency circuit further including a coupling circuit having a common node and configured to couple the common node to the one of the first and second groups through a first path and to couple the common node to the other group through a second path, the coupling circuit further configured such that the impedance provided by each filter of the one of the first and second groups for the signal in each band of the other group results in the signal being sufficiently excluded from the first path.

20. A wireless device comprising:
one or more antennas;
a front-end module in communication with the one or more antennas and including a radio-frequency circuit having a first group of plurality of filters each configured to support a band such that a first frequency range covers the respective plurality of bands, and a second group of one or more filters each configured to support a band such that a second frequency range covers the respective one or more bands, each filter of one of the first and second groups configured to provide an impedance at or near a short circuit impedance for a signal in each band of the other group, each filter of the other group configured to provide an approximately open circuit impedance for a signal in each band of the one of the first and second groups, the radio-frequency circuit further including a coupling circuit having a common node and configured to couple the common node to the one of the first and second groups through a first path and to couple the common node to the other group through a second path, the coupling circuit further configured such that the impedance provided by each filter of the one of the first and second groups for the signal in each band of the other group results in the signal being sufficiently excluded from the first path; and
a receiver configured to process one or more signals associated with the first and second group.

* * * * *